US011472962B2

(12) United States Patent
Shintou et al.

(10) Patent No.: US 11,472,962 B2
(45) Date of Patent: Oct. 18, 2022

(54) COMPOUND, INK, RESIST COMPOSITION FOR COLOR FILTER, SHEET FOR HEAT-SENSITIVE TRANSFER RECORDING, AND TONER

(71) Applicant: CANON KABUSHIKI KAISHA, Tokyo (JP)

(72) Inventors: Taichi Shintou, Saitama (JP); Koromo Shirota, Kawasaki (JP); Ai Hayakawa, Ashigarakami-gun (JP); Tsuyoshi Santo, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/925,588

(22) Filed: Jul. 10, 2020

(65) Prior Publication Data

US 2020/0339814 A1    Oct. 29, 2020

Related U.S. Application Data

(63) Continuation of application No. PCT/JP2019/000710, filed on Jan. 11, 2019.

(30) Foreign Application Priority Data

Jan. 17, 2018  (JP) .............................. JP2018-005282

(51) Int. Cl.

| C09B 55/00 | (2006.01) |
| C09D 11/328 | (2014.01) |
| G03F 7/00 | (2006.01) |
| G03F 7/105 | (2006.01) |
| G03G 9/09 | (2006.01) |

(52) U.S. Cl.
CPC .......... *C09B 55/009* (2013.01); *C09D 11/328* (2013.01); *G03F 7/0007* (2013.01); *G03F 7/105* (2013.01); *G03G 9/091* (2013.01)

(58) Field of Classification Search
CPC ... C09D 11/328; C09B 55/009; G03F 7/0007; G03F 7/105; G03G 9/091
USPC ........................................................ 514/119
See application file for complete search history.

(56) References Cited

U.S. PATENT DOCUMENTS

| 5,079,365 A * | 1/1992 | Sens ..................... B41M 5/3856 |
| | | 503/227 |
| 5,147,845 A * | 9/1992 | Sens ..................... B41M 5/3856 |
| | | 428/913 |
| 5,700,757 A | 12/1997 | Sens et al. |
| 6,265,345 B1 | 7/2001 | Yoshida et al. |
| 9,481,192 B2 * | 11/2016 | Nakano ................ B41M 5/3852 |
| 9,592,695 B2 * | 3/2017 | Katsumoto ............. B41M 5/388 |
| 9,701,146 B2 * | 7/2017 | Shirota ..................... C09B 1/22 |
| 10,195,886 B2 * | 2/2019 | Santo ..................... B41M 5/388 |
| 10,647,142 B2 * | 5/2020 | Shintou .................. C09B 23/143 |
| 2015/0360495 A1 | 12/2015 | Katsumoto et al. |
| 2016/0303882 A1 * | 10/2016 | Shirota .................... C09B 26/02 |
| 2020/0131371 A1 * | 4/2020 | Shintou .................... G03G 9/0924 |
| 2020/0347007 A1 * | 11/2020 | Shirota ................. B41M 5/3854 |
| 2021/0060995 A1 * | 3/2021 | Hayakawa .......... C09B 67/0033 |
| 2021/0115259 A1 * | 4/2021 | Shintou ................... G03F 7/027 |

FOREIGN PATENT DOCUMENTS

| CN | 104865796 A * | 8/2015 | ................ C08F 2/44 |
| DE | 4217973 A1 | 12/1993 | |
| EP | 0 416 432 A2 | 3/1991 | |
| EP | 0416434 A2 * | 3/1991 | .......... B41M 5/3856 |
| EP | 0761464 A1 * | 3/1997 | |
| JP | 3-166268 A | 7/1991 | |

(Continued)

OTHER PUBLICATIONS

International Search Report in International Application No. PCT/JP2019/000710 (dated Apr. 2019).
International Preliminary Report on Patentability in International Application No. PCT/JP2019/000710 (dated Jul. 2020).
Extended European Search Report in European Application No. 19740668.9 (dated Oct. 2021).

(Continued)

*Primary Examiner* — Daniel R Carcanague
(74) *Attorney, Agent, or Firm* — Venable LLP

(57) ABSTRACT

An object of the present invention is to provide a compound exhibiting a cyan color having properties such as high chroma, high light fastness, and high solubility. The compound is represented by the following General Formula (1).

General Formula (1)

In Formula (1), $R_1$ and $R_2$ each independently represent a linear, branched, or cyclic alkyl group having 6 or more and 12 or fewer carbon atoms, $R_3$ represents a 4-alkylphenyl group, a 4-halogenated phenyl group, or a 3-alkoxyphenyl group, $R_4$ represents a linear, branched, or cyclic alkyl group having 1 or more and 8 or fewer carbon atoms, and $R_5$ represents a linear, branched, or cyclic alkyl group having 1 or more and 8 or fewer carbon atoms or a benzyl group.

7 Claims, 1 Drawing Sheet

(56) References Cited

FOREIGN PATENT DOCUMENTS

| | | | |
|---|---|---|---|
| JP | 8-245896 A | 9/1996 | |
| JP | 2000-006540 A | 1/2000 | |
| JP | 2003-213152 A | 7/2003 | |
| JP | 2014-015607 A | 1/2014 | |
| JP | 2015-178270 A | 10/2015 | |
| WO | 2013/187493 A1 | 12/2013 | |
| WO | WO-2013187493 A1 * | 12/2013 | ............. G03F 7/038 |
| WO | 2019/142736 A1 | 7/2019 | |
| WO | 2019/146506 A1 | 8/2019 | |

OTHER PUBLICATIONS

Notice of Reasons for Refusal in Japanese Application No. 2019-005674 (dated Aug. 2022).

* cited by examiner

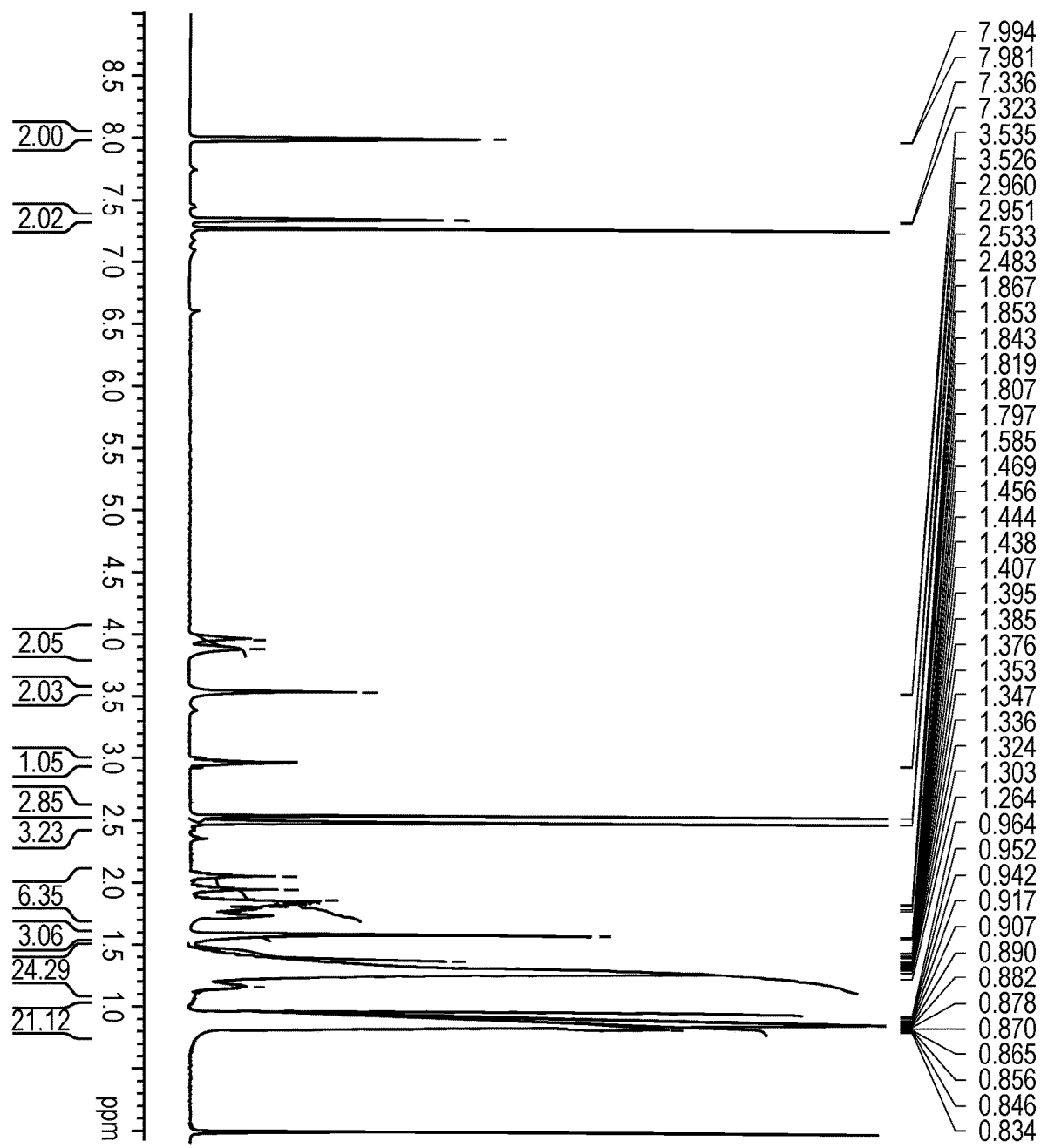

COMPOUND, INK, RESIST COMPOSITION FOR COLOR FILTER, SHEET FOR HEAT-SENSITIVE TRANSFER RECORDING, AND TONER

CROSS-REFERENCE TO RELATED APPLICATIONS

This application is a Continuation of International Patent Application No. PCT/JP2019/000710, filed Jan. 11, 2019, which claims the benefit of Japanese Patent Application No. 2018-005282, filed Jan. 17, 2018, both of which are hereby incorporated by reference herein in their entirety.

BACKGROUND OF THE INVENTION

Field of the Invention

The present invention relates to a compound, and to an ink, a resist composition for a color filter, a sheet for heat-sensitive transfer recording, and a toner that are obtained by using the compound.

Description of the Related Art

In a color display using a liquid crystal, a color filter is used. The color filter is essential to display color of a liquid crystal display and is an important component determining performance of the liquid crystal display. As a method of producing a color filter according to the related art, a dying method, a printing method, an ink jet method, and a photoresist method have been known. Among them, a photoresist method has been primarily used because the photoresist method facilitates a control of spectral characteristics and color reproducibility, and implements high resolution and higher precision patterning.

In the production of a color filter by a photoresist method, in general, a pigment has been used as a coloring agent. However, a color filter using a pigment has many problems, such as depolarization (destruction of polarization), reduction in a contrast ratio of color display of a liquid crystal display, reduction in brightness of a color filter, and reduction in dispersion stability to an organic solvent or a polymer. Therefore, a method of producing a color filter using a dye as a coloring agent has been spotlighted. In International Publication No. WO 2013/187493, a color filter using an azomethine-based colorant as a coloring agent has been reported.

In addition, in recent years, with the spread of a portable color display device, a demand for easy color printing of photos captured and processed by using the device and documents prepared by using the device has been rapidly increased.

As a color printing method, an electrophotographic method, an ink jet method, a heat-sensitive transfer recording method, and the like have been known. Among them, a heat-sensitive transfer recording method is excellent as a method by which printing can be easily performed regardless of a surrounding environment, because the heat-sensitive transfer recording method enables printing to be performed by a dry process and allows a printer to be downsized and to have excellent portability. In the heat-sensitive transfer recording method, a dye contained in a transfer sheet and an ink composition for a transfer sheet is a very important material because the dye affects a speed of transfer recording and an image quality and storage stability of a recorded matter. As an example of a colorant used for the heat-sensitive transfer recording method, an azomethine-based colorant used to improve light fastness has been reported (see Japanese Patent Application Laid-Open No. 2000-006540).

In addition, even in the field of a color toner used in the electrophotographic method, in order to improve color development, an example in which a dye is used, as a coloring agent, instead of a pigment used in the related art has been reported. As an example, an example in which an azomethine-based dye used as a coloring agent of a toner has been disclosed in German Patent Publication No. DE 4217973.

Furthermore, digital textile printing using an ink jet method or an electrophotographic method has been spread in the market as a method capable of providing a textile printing product at low energy and low cost. In particular, a method of dying synthesis fiber such as polyester with a sublimation dye has been recently spotlighted from the viewpoints of process simplification and free drainage. In this use, the dye is required to be sublimated, and an anthraquinone-based cyan color is used without using phthalocyanine having a high molecular weight, but there is a problem in the color development.

In the dye having another structure described in the literature described above, the dye becomes bluish or greenish due to difficulty in adjustment of a substituent. Thus, these dyes have low chroma and low light fastness and easily aggregate.

In the dye having another structure described in the literature described above, the dye becomes bluish or greenish due to difficulty in adjustment of a substituent. Thus, these dyes have low chroma and low light fastness and easily aggregate.

SUMMARY OF THE INVENTION

The present invention relates to a compound represented by the following General Formula (1).

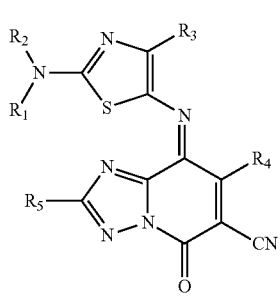

General Formula (1)

[In Formula (1), $R_1$ and $R_2$ each independently represent a linear, branched, or cyclic alkyl group having 6 or more and 12 or fewer carbon atoms, $R_3$ represents a 4-alkylphenyl group, a 4-halogenated phenyl group, or a 3-alkoxyphenyl group, $R_4$ represents a linear, branched, or cyclic alkyl group having 1 or more and 8 or fewer carbon atoms, and $R_5$ represents a linear, branched, or cyclic alkyl group having 1 or more and 8 or fewer carbon atoms or a benzyl group.]

In addition, the present invention relates to an ink containing a medium and a compound present in a dissolved or dispersed state in the medium, wherein the compound is the compound described above.

In addition, the present invention relates to a resist composition for a color filter containing the compound described above.

In addition, the present invention relates to a sheet for heat-sensitive transfer recording including a substrate and a coloring material layer formed on the substrate, wherein the compound described above is contained in the coloring material layer.

In addition, the present invention relates to a toner containing a binder resin and a coloring agent, wherein the coloring agent contains the compound described above.

Further features of the present invention will become apparent from the following description of exemplary embodiments with reference to the attached drawings.

BRIEF DESCRIPTION OF THE DRAWINGS

The FIGURE is a view illustrating a 1H-NMR spectrum of a compound (1-4) of the present invention.

DESCRIPTION OF THE EMBODIMENTS

Hereinafter, embodiments of the present invention will be described in detail, but the present invention is not limited thereto.

As a result of intensive studies in order to solve the above problems, the present inventors found that a compound exhibiting a cyan color having excellent high chroma, high light fastness, and storage stability may be obtained by limiting the compound to the combination corresponding to $R_1$ to $R_5$ in General Formula (1) of the present invention.

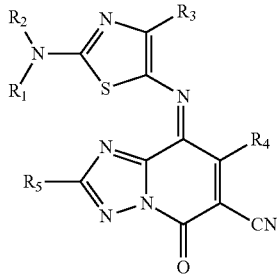

General Formula (1)

[In Formula (1), $R_1$ and $R_2$ each independently represent a linear, branched, or cyclic alkyl group having 6 or more and 12 or fewer carbon atoms, $R_3$ represents a 4-alkylphenyl group, a 4-halogenated phenyl group, or a 3-alkoxyphenyl group, $R_4$ represents a linear, branched, or cyclic alkyl group having 1 or more and 8 or fewer carbon atoms, and $R_5$ represents a linear, branched, or cyclic alkyl group having 1 or more and 8 or fewer carbon atoms or a benzyl group.]

It was confirmed in the experiment that the compound has a structure similar to a structure described in the related art, but in a structure in which $R_1$ and $R_2$ each have 4 or fewer carbon atoms, the compound is not only easily condensed, but also has low light fastness due to low solubility of the compound in a solvent. In a case of a substituent other than $R_3$ of the present invention, the compound is greatly biased to blue or green and does not exhibit a cyan color. On the other hand, it is considered that in the case of the compound of the present invention, since the compound has a sterically twisted structure, an interaction of compounds in a molecule or between molecules can be suppressed, and aggregation can be controlled. Therefore, it is considered that the compound exhibiting a cyan color having excellent high chroma, high light fastness, and storage stability is obtained.

In addition, it was found that it is possible to obtain an ink, a resist composition for a color filter, a sheet for heat-sensitive transfer recording, and a toner that exhibit a cyan color having excellent high chroma, high light fastness, and storage stability by using the compound represented by General Formula (1).

First, the compound represented by General Formula (1) will be described.

In General Formula (1), the linear, branched, or cyclic alkyl group having 6 or more and 12 or fewer carbon atoms represented by each of $R_1$ and $R_2$ is not particularly limited, but examples thereof can include an n-hexyl group, an n-heptyl group, an n-octyl group, an n-nonyl group, an n-decyl group, an n-undecyl group, an n-dodecyl group, a 2-ethylhexyl group, and a cyclohexyl group.

Among them, an alkyl group having 8 carbon atoms is preferable, and in particular, a branched alkyl group such as a 2-ethylhexyl group is more preferable, from the viewpoint of obtaining a compound exhibiting a cyan color having excellent high chroma, high light fastness, and storage stability.

In General Formula (1), the 4-alkylphenyl group represented by $R_3$ is not particularly limited, but is a linear or branched alkylphenyl group having 1 or more and 4 or fewer carbon atoms. Specifically, examples thereof can include a 4-methylphenyl group, a 4-ethylphenyl group, a 4-n-propylphenyl group, a 4-isopropylphenyl group, a 4-n-butylphenyl group, a 4-sec-butylphenyl group, and a 4-tert-butylphenyl group. Among them, a 4-methylphenyl group is preferable from the viewpoint of obtaining a compound exhibiting a cyan color having excellent high chroma, high light fastness, and storage stability.

In General Formula (1), the 4-halogenated phenyl group represented by $R_3$ is not particularly limited, but examples thereof can include a 4-chlorophenyl group, a 4-bromophenyl group, and a 4-fluorophenyl group. Among them, a 4-chlorophenyl group is preferable from the viewpoint of obtaining a compound exhibiting a cyan color having excellent high chroma, high light fastness, and storage stability.

In General Formula (1), the 3-alkoxyphenyl group represented by $R_3$ is not particularly limited, but is a linear or branched alkylphenyl group having 1 or more and 4 or fewer carbon atoms. Specifically, examples thereof can include a 3-methoxyphenyl group, a 3-ethoxyphenyl group, a 3-propoxyphenyl group, a 3-isopropoxyphenyl group, a 3-butoxyphenyl group, and 3-tert-butoxyphenyl group. Among them, a 3-methoxyphenyl group is preferable from the viewpoint of obtaining a compound exhibiting a cyan color having excellent high chroma, high light fastness, and storage stability.

In General Formula (1), the linear, branched, or cyclic alkyl group having 1 or more and 8 or fewer carbon atoms represented by $R_4$ is not particularly limited, but examples thereof can include a linear, branched, or cyclic alkyl group such as a methyl group, an ethyl group, an n-propyl group, an iso-propyl group, an n-butyl group, a sec-butyl group, a tert-butyl group, a pentyl group, a hexyl group, a heptyl group, an octyl group, a cyclopropyl group, a cyclobutyl group, a cyclopentyl group, a cyclohexyl group, a methylcyclohexyl group, a 2-ethylpropyl group, or a 2-ethylhexyl group. Among them, an alkyl group having 1 or more and 4 or fewer carbon atoms is preferable.

In General Formula (1), $R_5$ is a linear, branched, or cyclic alkyl group having 1 or more and 8 or fewer carbon atoms or a benzyl group, and the alkyl group represented by $R_5$ is not particularly limited, but examples thereof can include a linear, branched, or cyclic alkyl group such as a methyl group, an ethyl group, an n-propyl group, an iso-propyl group, an n-butyl group, a sec-butyl group, a tert-butyl group, a pentyl group, a hexyl group, a heptyl group, an octyl group, a cyclopropyl group, a cyclobutyl group, a cyclopentyl group, a cyclohexyl group, a methylcyclohexyl group, a 2-ethylpropyl group, or a 2-ethylhexyl group. Among them, an alkyl group having 1 or more and 4 or fewer carbon atoms is preferable.

Next, a method of producing the compound represented by General Formula (1) according to the present invention will be described. The compound of the present invention can be synthesized with reference to a known method described in the patent literature (Japanese Patent Application Laid-Open No. H08-245896). Hereinafter, an example of the method of producing the compound of the present invention will be described, but the production method is not limited thereto.

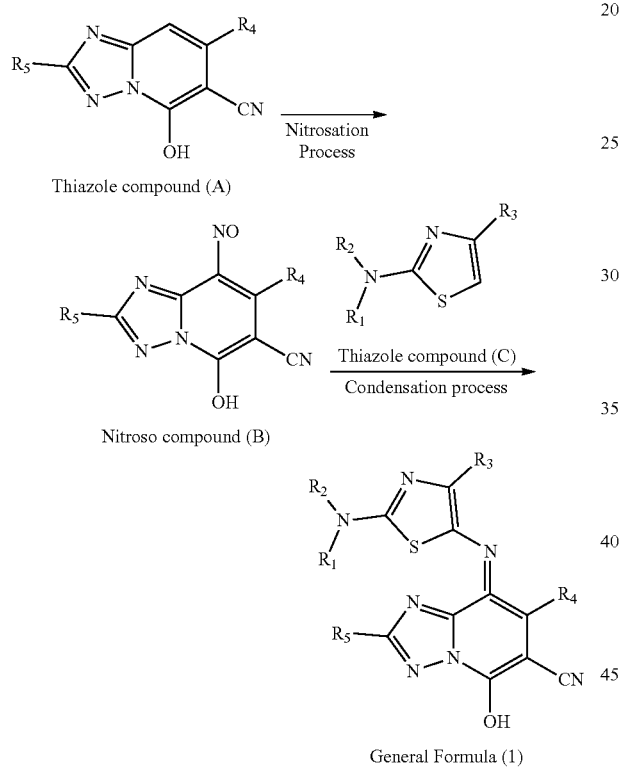

It should be noted that $R_1$ to $R_5$ of the compounds in the above reaction formulas are the same as those described above. In addition, although cis-trans isomers are present in the compound represented by General Formula (1), the isomers are both in the category of the present invention, and the compound represented by General Formula (1) may also be a mixture thereof.

The compound of the present invention represented by General Formula (1) can be produced by performing a nitrosation process in which a triazole compound (A) is induced to a nitroso compound and then performing a condensation reaction in which the nitroso compound is condensed with a thiazole compound (C).

[Nitrosation Process]

A condensation process of obtaining the compound of the present invention represented by General Formula (1) will be described.

The compound of the present invention can be produced by performing a nitrosation process in which a triazole compound (A) is induced to a nitroso compound and then performing a condensation reaction in which the nitroso compound is condensed with a thiazole compound (C).

Preferred examples of the triazole compound (A) include the following (A-1) to (A-14), but the present invention is not limited thereto.

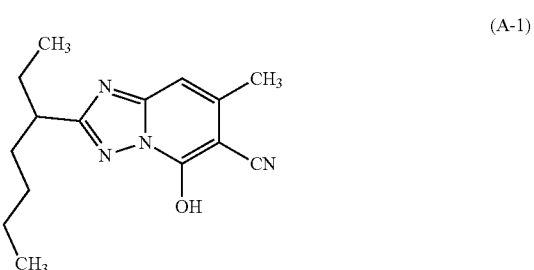

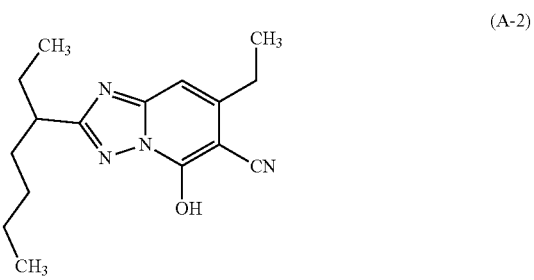

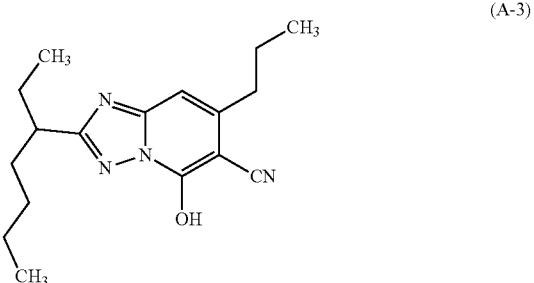

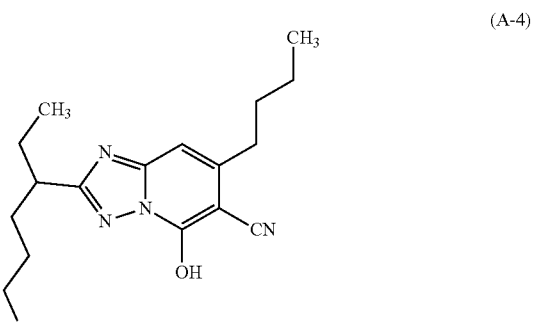

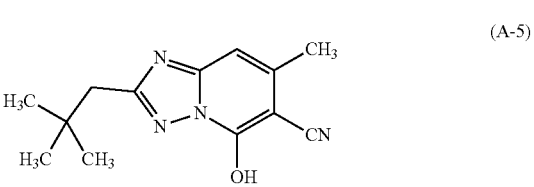

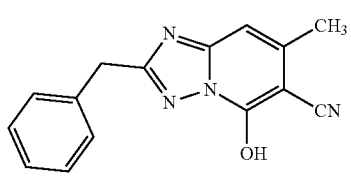 (A-6)
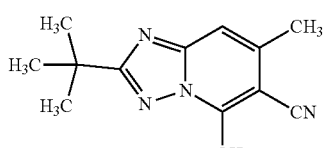 (A-7)
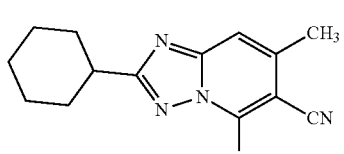 (A-8)
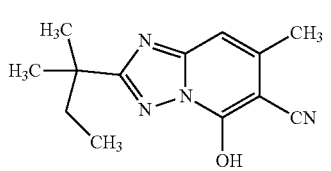 (A-9)
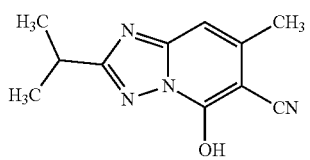 (A-10)
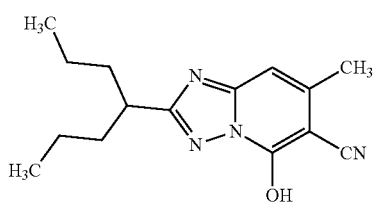 (A-11)
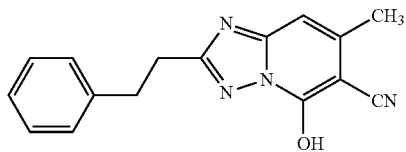 (A-12)
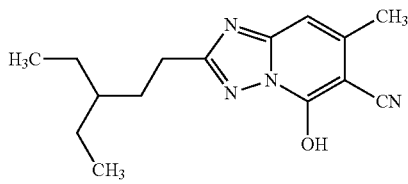 (A-13)
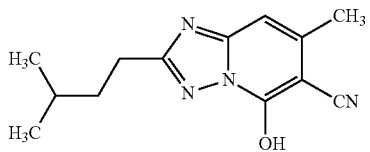 (A-14)
Preferred examples of the thiazole compound (C) include the following (C-1) to (C-18), but the present invention is not limited thereto.
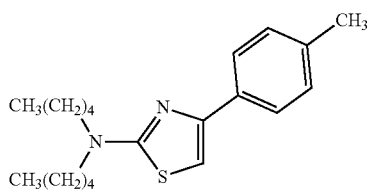 (C-1)
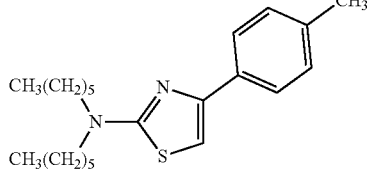 (C-2)
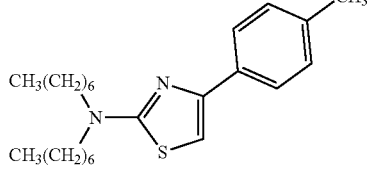 (C-3)
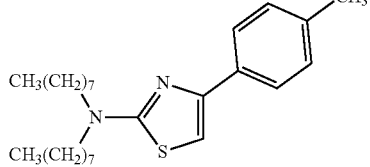 (C-4)
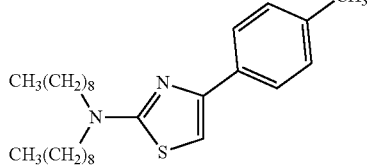 (C-5)
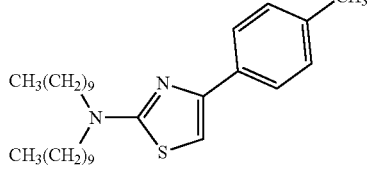 (C-6)
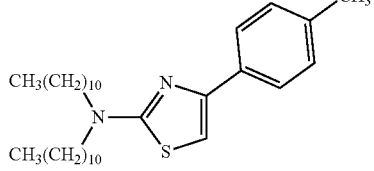 (C-7)
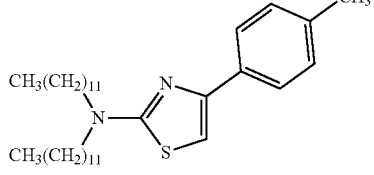 (C-8)

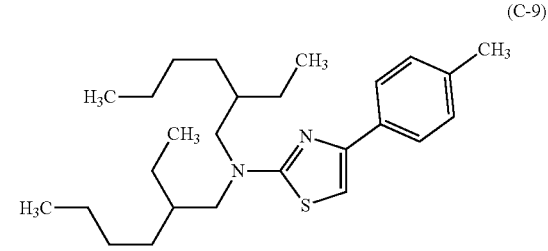
(C-9)

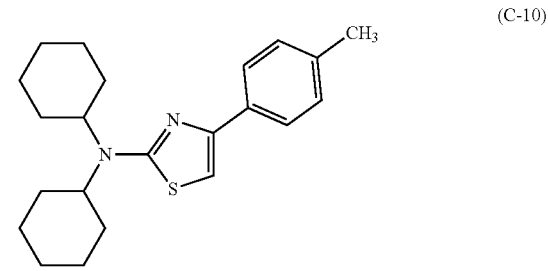
(C-10)

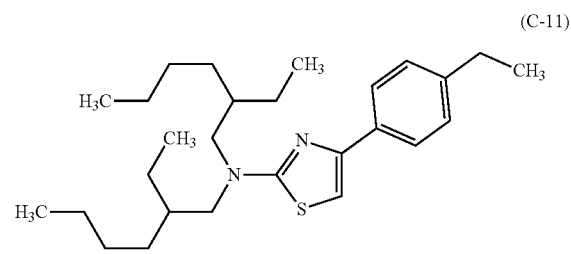
(C-11)

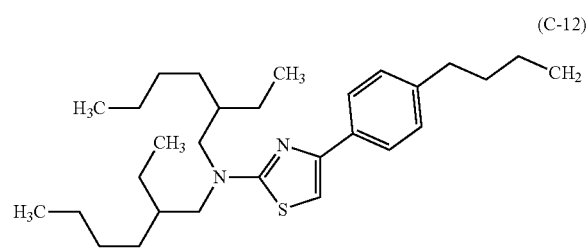
(C-12)

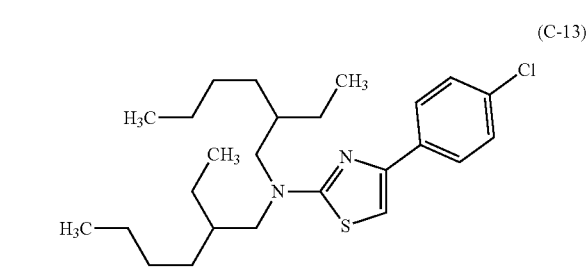
(C-13)

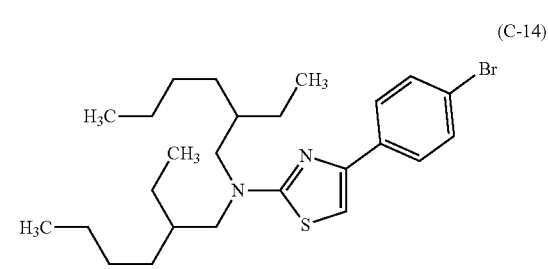
(C-14)

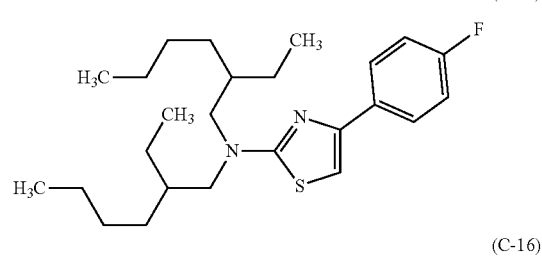
(C-15)

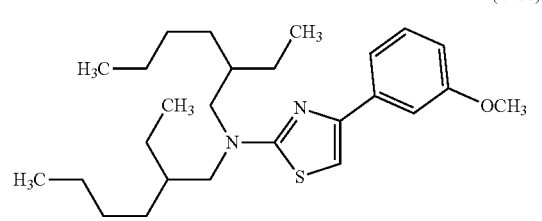
(C-16)

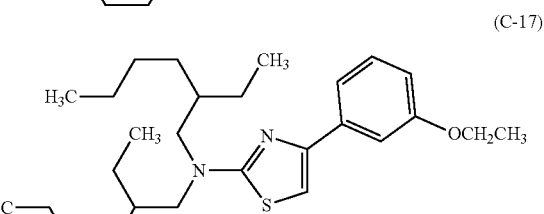
(C-17)

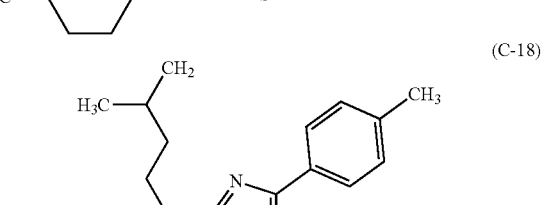
(C-18)

The condensation reaction can be performed in the absence of a solvent, and is preferably performed in the presence of a solvent. As the solvent, any solvent may be used without particular limitation as long as the reaction is not inhibited, and examples of the solvent can include chloroform, dichloromethane, N,N-dimethylformamide, toluene, xylene, tetrahydrofuran, dioxane, acetonitrile, ethyl acetate, methanol, ethanol, and isopropanol. These solvents may be used alone or as a mixture of two or more thereof. A mixing ratio when the solvents are used as a mixture can be arbitrarily determined. The amount of the reaction solvent used is preferably 0.1 mass % or more and 1000 mass % or less, and more preferably 1.0 mass % or more and 150 mass % or less, with respect to an aldehyde compound (A).

A reaction temperature of the condensation reaction is preferably in a range of −80° C. or higher and 250° C. or lower, and more preferably −20° C. or higher and 150° C. or lower. In general, the condensation reaction is terminated within 24 hours.

In addition, in the condensation reaction, in order to promote the reaction, an acid or a base is preferably used. Specifically, examples of the acid can include an inorganic acid such as hydrochloric acid, sulfuric acid, or phosphoric acid; and an organic acid such as p-toluene sulfonic acid, formic acid, acetic acid, propionic acid, or trifluoroacetic acid. In addition, similarly to the acid, a weak acidic salt such as ammonium formate or ammonium acetate can be used. Among them, p-toluene sulfonic acid, ammonium formate, or ammonium acetate is preferable. The amount of the acid used is preferably 0.01 mass % or more and 20 mass % or less, and more preferably 0.1 to 5 mass %, with respect to a thiazole compound (A).

In addition, specifically, examples of the base can include an organic base such as pyridine, 2-methylpyridine, piperidine, diethylamine, diisopropylamine, triethylamine, phenylethylamine, isopropylethylamine, methylaniline, 1,4-diazabicyclo[2.2.2]octane (DABCO), tetrabutylammonium hydroxide, or 1,8-diazabicyclo[5.4.0]undecene (DBU); an organic metal such as n-butyl lithium or tert-butyl magnesium chloride; an inorganic base such as sodium borohydride, metal sodium, potassium hydride, or calcium oxide; and a metal alkoxide such as potassium tert-butoxide, sodium tert-butoxide, or sodium ethoxide. Among them, triethylamine or piperidine is preferable, and triethylamine is more preferable. The amount of the base used is preferably 0.1 mass % or more and 20 mass % or less, and more preferably 0.2 mass % or more and 5 mass % or less, with respect to the thiazole compound (A). In addition, similarly to the base, a weak basic salt such as potassium acetate can be used.

After the condensation reaction is terminated, post-processing is performed according to a post-processing method generally used in an organic synthesis reaction, and if necessary, purification such as a liquid separating operation, re-crystallization, re-deposition, or column chromatography is performed, such that the compound of the present invention represented by General Formula (1) can be obtained in high purity.

Preferred examples of the compound of the present invention represented by General Formula (1) include the following (1-1) to (1-24), but the present invention is not limited thereto.

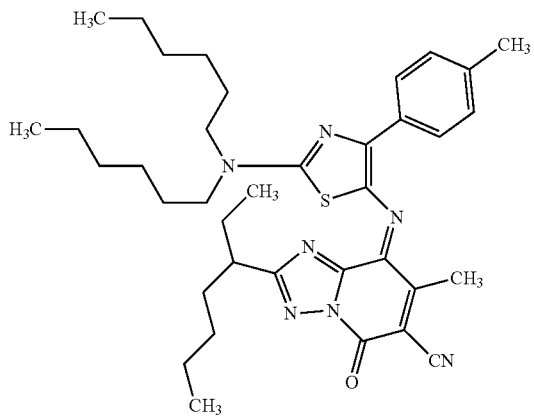

(1-2)

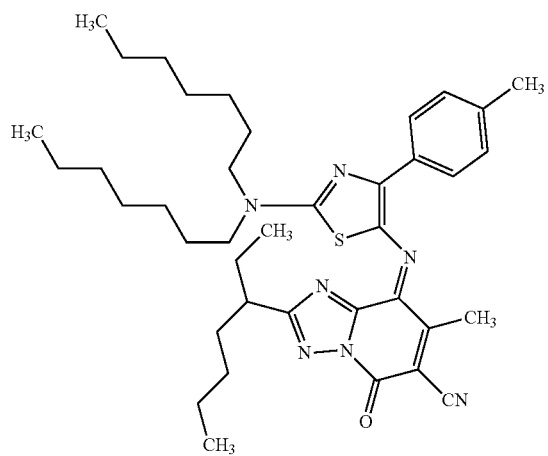

(1-3)

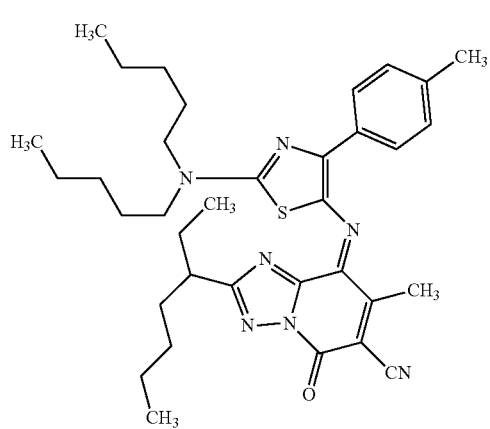

(1-1)

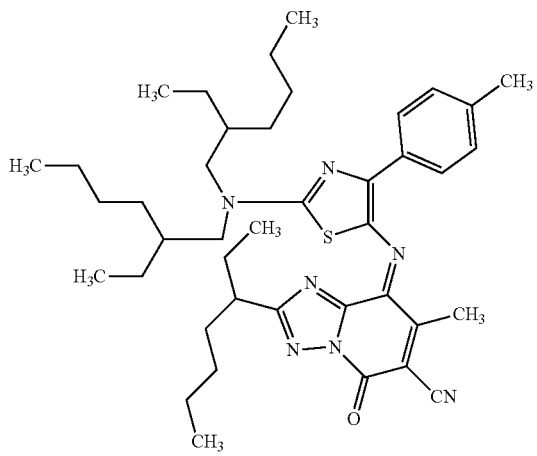

(1-4)

-continued
(1-5)
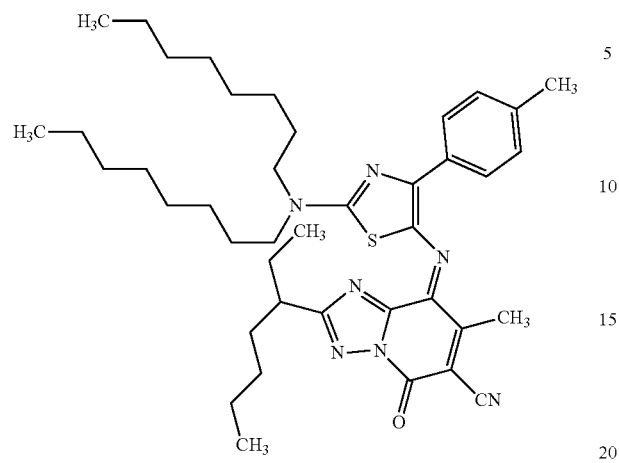
(1-6)
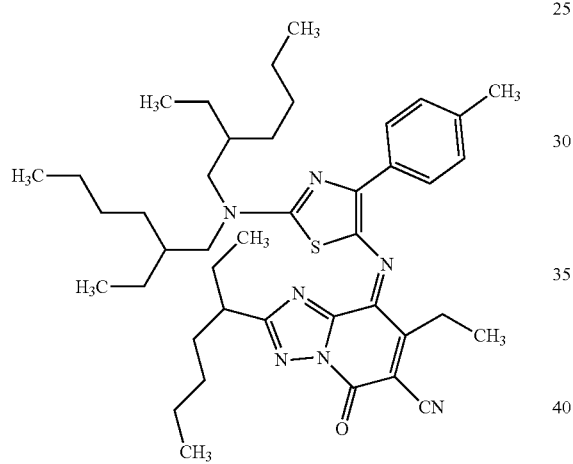
(1-7)
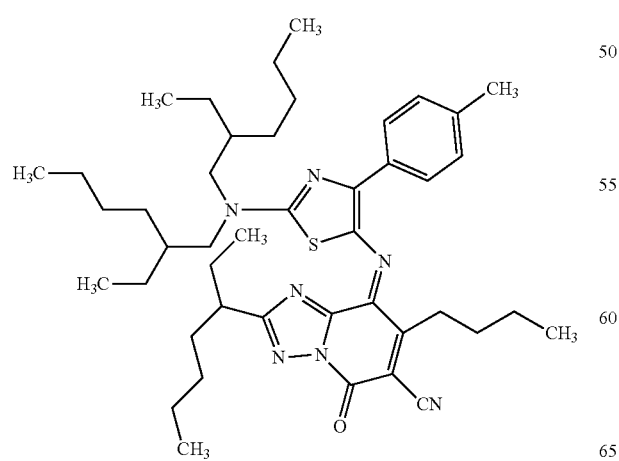
(1-8)
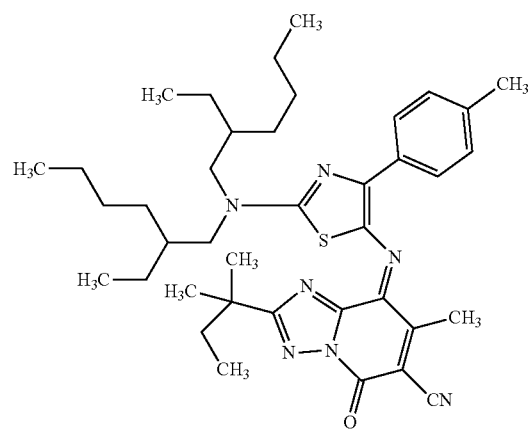
(1-9)
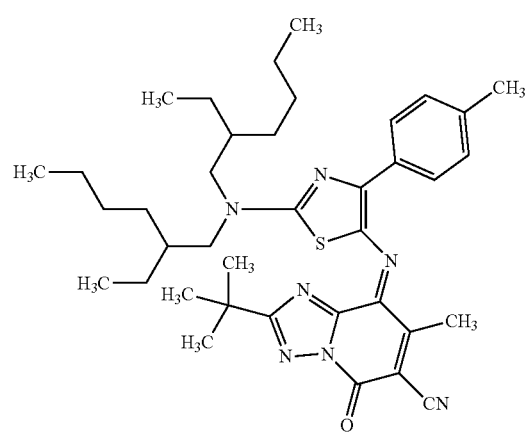
(1-10)
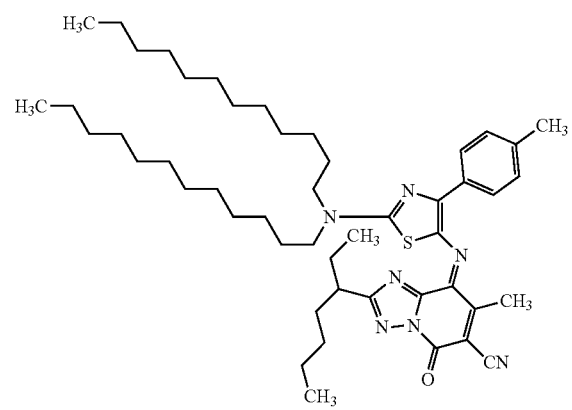

(1-11)
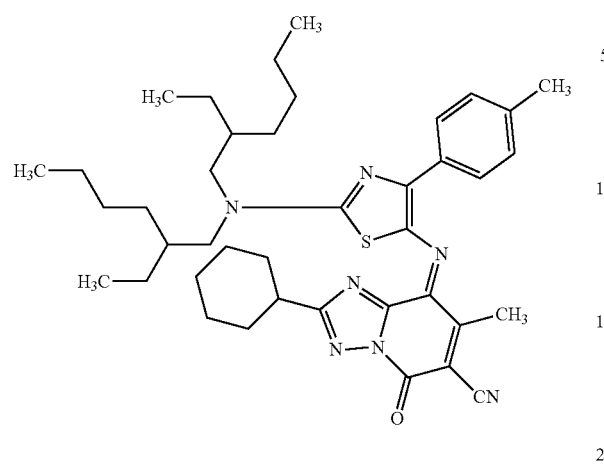
(1-12)
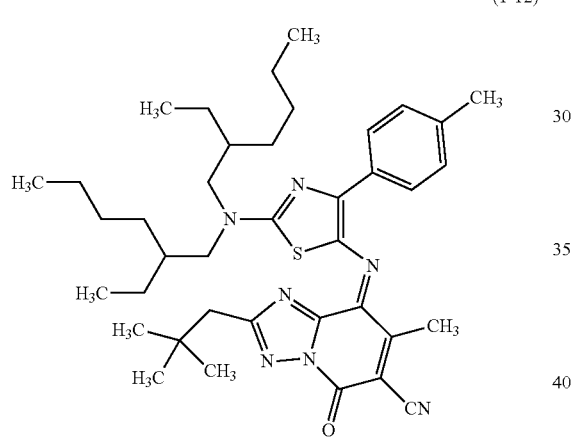
(1-13)
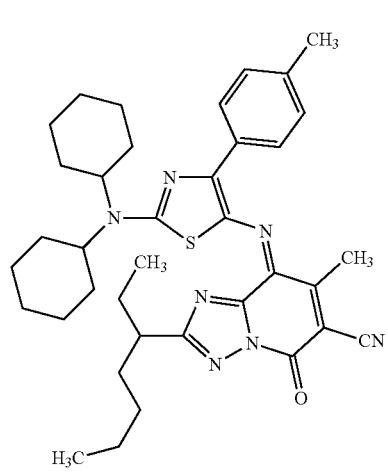
(1-14)
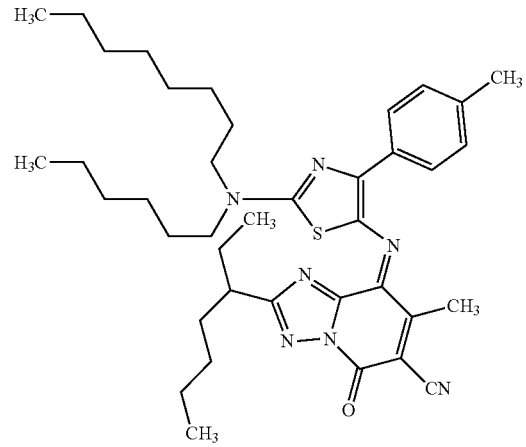
(1-15)
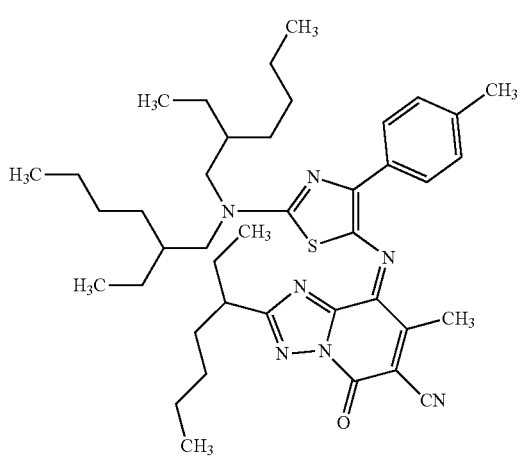
(1-16)
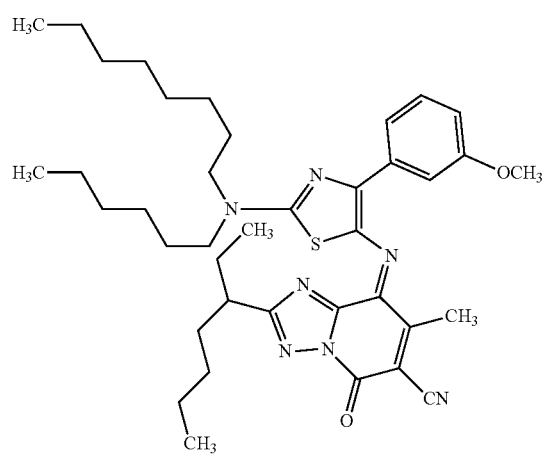

(1-17)
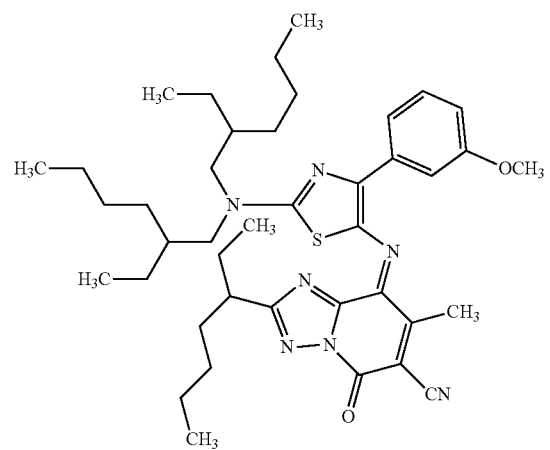
(1-18)
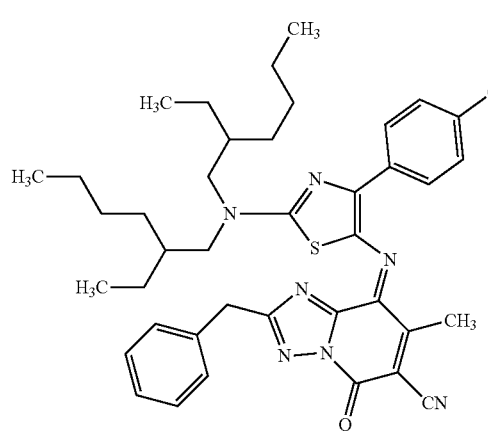
(1-20)
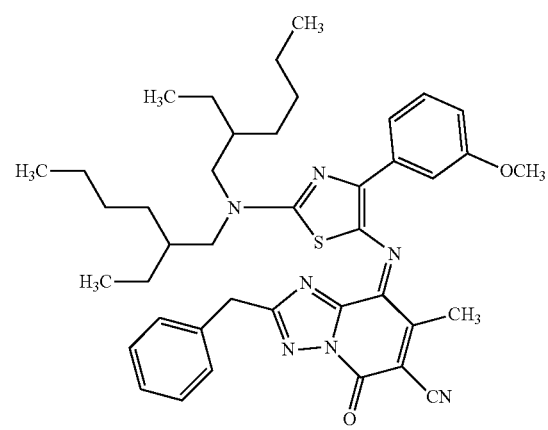
(1-21)
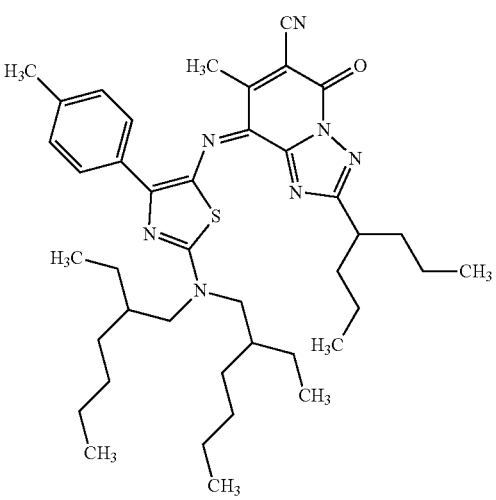
(1-19)
(1-22)
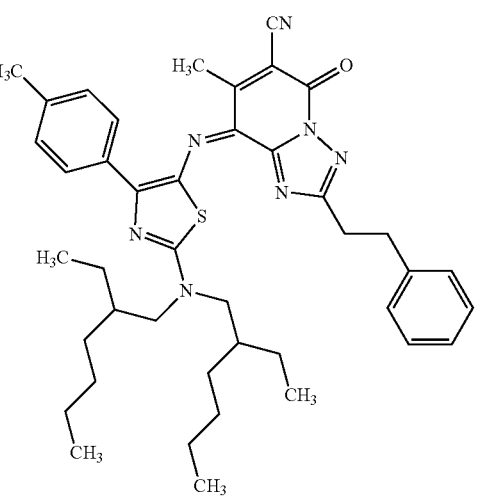

-continued (1-23)

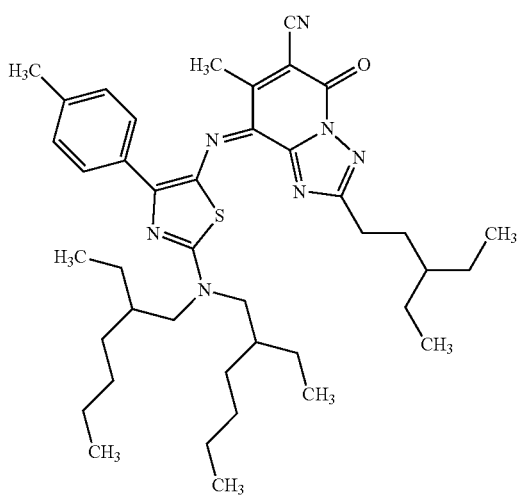

(1-24)

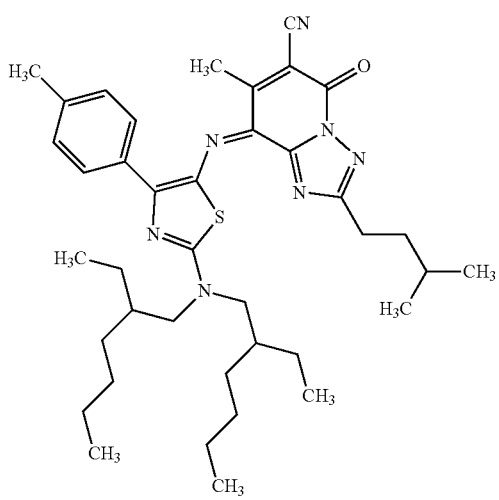

The compounds represented by General Formula (1) may be used alone, or, if necessary, in combination of two or more thereof in order to adjust a tone and the like. Furthermore, the compound can be used in combination with a known pigment or dye. Two or more known pigments or dyes may be used in combination.

Hereinafter, an ink, a resist composition for a color filter, a sheet for heat-sensitive transfer recording, and a toner that are obtained by using the compound represented by General Formula (1) will be described in this order.

<Ink>

First, the ink according to the present invention will be described. The compound represented by General Formula (1) exhibits a cyan color having excellent high chroma, high light fastness, and storage stability. Therefore, the compound is suitable as a coloring agent of the ink. The ink of the present invention contains a medium and the compound represented by General Formula (1) as a coloring agent. The compound is present in a dissolved or dispersed state in the medium. In the ink of the present invention, a constituent component other than the compound represented by General Formula (1) is adequately selected depending on an application of the ink. In addition, in a range in which characteristics for various applications are not degraded, an additive and the like may be adequately added.

The ink of the present invention is preferably used as an ink for a transfer sheet for a heat-sensitive transfer recording type printer, printing ink, paint, writing ink, and textile printing ink.

When the ink of the present invention is used as a textile printing ink, fabric on which textile printing can be performed is not particularly limited as long as it can be dyed, and examples thereof can include fabric made of fibers containing polyester, acetate, and triacetate. The fabric may be in any form such as woven fabric, knitted fabric, nonwoven fabric, or the like. In addition, fabric made of cotton, silk, hemp, polyurethane, acryl, nylon, wool, or rayon fiber, or blended fabric of two or more of these fibers can be used.

A thickness of a yarn forming the fabric is preferably in a range of 10 denier or more and 100 denier or less. In addition, a thickness of a fiber forming the yarn is not particularly limited, but is preferably 1 denier or less.

The ink of the present invention can be prepared as follows.

The compound of the present invention is gradually added to the medium together with another coloring agent, an emulsifier, a resin, and the like, if necessary, while performing stirring to be sufficiently mixed with the medium. Furthermore, the ink of the present invention can be obtained by applying a mechanical shearing force and performing stable dissolution or fine dispersion with a disperser.

[Medium]

In the present invention, the "medium" refers to water or an organic solvent. In a case where an organic solvent is used as the medium, the kind of organic solvent is selected depending on a purpose or an application of the ink and is not particularly limited. Examples of the organic solvent can include alcohols such as methanol, ethanol, modified ethanol, isopropanol, n-butanol, isobutanol, tert-butanol, sec-butanol, 2-methyl-2-butanol, 3-pentanol, octanol, benzyl alcohol, and cyclohexanol; glycols such as methyl cellosolve, ethyl cellosolve, diethylene glycol, and diethylene glycol monobutyl ether; ketones such as acetone, methyl ethyl ketone, and methyl isobutyl ketone; esters such as ethyl acetate, butyl acetate, ethyl propionate, and cellosolve acetate; aliphatic hydrocarbons such as hexane, octane, petroleum ether, and cyclohexane; aromatic hydrocarbons such as benzene, toluene, and xylene; halogenated hydrocarbons such as carbon tetrachloride, trichloroethylene, and tetrabromoethane; ethers such as diethyl ether, dimethyl glycol, trioxane, and tetrahydrofuran; acetals such as methylal and diethyl acetal; organic acids such as formic acid, acetic acid, and propionic acid; and sulfur or nitrogen-containing organic compounds such as nitrobenzene, dimethylamine, monoethanolamine, pyridine, dimethyl sulfoxide, and dimethylformamide.

In addition, as the organic solvent, a polymerizable monomer can be used. Examples of the polymerizable monomer can include an addition polymerizable monomer and a condensation monomer, and an addition polymerizable monomer is preferable. Specifically, examples of the polymerizable monomer can include a styrene-based monomer such as styrene, α-methylstyrene, α-ethylstyrene, o-methylstyrene, m-methylstyrene, p-methylstyrene, o-ethylstyrene, m-ethylstyrene, or p-ethylstyrene; an acrylate-based monomer such as methyl acrylate, ethyl acrylate, propyl acrylate, butyl acrylate, octyl acrylate, dodecyl acrylate, stearyl acrylate, behenyl acrylate, 2-ethylhexyl acrylate, dimethylaminoethyl acrylate, diethylaminoethyl acrylate, acrylonitrile, or amide acrylate; a methacrylate-based monomer such as methyl methacrylate, ethyl methacrylate, propyl methacrylate, butyl methacrylate, octyl methacrylate, dodecyl methacrylate, stearyl methacrylate, behenyl methacrylate, 2-ethylhexyl methacrylate, dimethylaminoethyl methacrylate, diethylaminoethyl methacrylate, methacrylonitrile, or amide methacrylate; an olefin-based monomer such as ethylene, propylene, butylene, butadiene, isoprene, isobutylene, or cyclohexane; a halogenated vinyl-based monomer such as vinyl chloride, vinylidene chloride, vinyl bromide, or vinyl iodide; a vinyl ester-based monomer such as vinyl acetate, vinyl propionate, or vinyl benzoic acid; a vinyl ether-based monomer such as vinyl methyl ether, vinyl ethyl ether, or vinyl isobutyl ether; and a vinyl ketone-based monomer such as vinyl methyl ketone, vinyl hexyl ketone, or methyl isopropenyl ketone. These polymerizable monomers may be used alone, or, if necessary, in combination of two or more thereof.

[Dispersant]

In a case where water is used as the medium of the ink according to the present invention, in order to obtain excellent dispersion stability of the coloring agent, a dispersant may be added, if necessary. The dispersant is not particularly limited, but examples thereof can include a cationic surfactant, an anionic surfactant, and a nonionic surfactant.

Examples of the cationic surfactant can include dodecylammonium chloride, dodecylammonium bromide, dodecyltrimethylammonium bromide, dodecylpyridinium chloride, dodecylpyridinium bromide, and hexadecyltrimethylammonium bromide.

Examples of the anionic surfactant can include a fatty acid soap such as sodium stearate or sodium dodecanoate, sodium dodecyl sulfate, sodium dodecylbenzene sulfate, sodium lauryl sulfate, naphthalene, and a formalin condensate of β-naphthalene sulfonic acid.

Examples of the nonionic surfactant can include dodecyl polyoxyethylene ether, hexadecyl polyoxyethylene ether, nonylphenyl polyoxyethylene ether, lauryl polyoxyethylene ether, sorbitan monooleate polyoxyethylene ether, and monodecanoyl sucrose.

[Coloring Agent]

In the coloring agent constituting the ink of the present invention, although the compound represented by General Formula (1) is used, the compounds may be used alone, or in combination of two or more thereof. In addition, within a range in which solubility or dispersibility of the compound to the medium is not inhibited, another coloring agent such as a known dye may also be used together. The other coloring agent that can be used together is not particularly limited, but examples thereof can include a condensed azo compound, an azo metal complex, and a methine compound.

A content of the coloring agent is preferably 1.0 part by mass or more and 30 parts by mass or less, more preferably 2.0 parts by mass or more and 20 parts by mass or less, and particularly preferably 3.0 parts by mass or more and 15 parts by mass or less, with respect to 100 parts by mass of the medium. Within the above range, sufficient coloring power can be obtained and dispersibility of the coloring agent is excellent.

[Resin]

The ink of the present invention may further contain a resin. The kind of resin is determined depending on the purpose or the application of the ink, but is not particularly limited. Examples of the resin can include a styrene-based polymer, an acrylic acid-based polymer, a methacrylic acid-based polymer, a polyester resin, a polyvinyl ether resin, a polyvinyl methyl ether resin, a polyvinyl alcohol resin, a polyvinyl butyral resin, a polyurethane resin, and a polypeptide resin. These resins may be used alone, or, if necessary, in combination of two or more thereof.

The disperser is not particularly limited, but a media type disperser such as a rotating shear type homogenizer, a ball mill, a sand mill, or an attritor, or a high-pressure counter collision type disperser can be used.

As described above, since the ink of the present invention contains the compound represented by General Formula (1), it is possible to provide an ink exhibiting a cyan color having excellent high chroma, high light fastness, and storage stability.

<Sheet for Heat-Sensitive Transfer Recording>

Next, the sheet for heat-sensitive transfer recording according to the present invention will be described. Since the compound of the present invention exhibits a cyan color having excellent high chroma, high light fastness, and storage stability, the compound can be preferably used for the sheet for heat-sensitive transfer recording.

The sheet for heat-sensitive transfer recording according to the present invention includes a substrate and a coloring material layer formed on the substrate in a film form by using a composition containing the compound of the present invention. The coloring material layer has at least a yellow layer, a magenta layer, and a cyan layer.

In a heat-sensitive transfer recording method, in a state in which the coloring material layer of the sheet for heat-sensitive transfer recording is overlapped with an image receiving sheet having a surface on which a coloring material receiving layer is provided, when the sheet for heat-sensitive transfer recording is heated using a heating unit such as a thermal head, coloring materials of the sheet are transferred onto the image receiving sheet and image formation is performed.

Specifically, the cyan layer in the coloring material layer is formed by applying the ink of the present invention described above to a substrate sheet and drying the ink. Hereinafter, more details will be described.

A coloring material containing the compound represented by General Formula (1), a binder resin, and if necessary, a surfactant and a wax are gradually added to the medium while performing stirring to be sufficiently mixed with the medium. Subsequently, the composition is stably dissolved or dispersed into a fine particle shape by applying a mechanical shearing force with a disperser, thereby preparing an ink. The ink is applied to a base film, which is a substrate, and then dried to form a coloring material layer. Furthermore, if necessary, a transfer protective layer and a heat resistant lubricant layer to be described below are formed, thereby obtaining the sheet for heat-sensitive transfer recording of the present invention. The sheet for heat-sensitive transfer recording of the present invention is not limited to a sheet for heat-sensitive transfer recording prepared by the above production method. Hereinafter, respective components used in the coloring material layer will be described in detail.

[Coloring Material]

In the coloring material, although the compound represented by General Formula (1) is used, the compounds may be used alone, or in combination of two or more thereof. In addition, a coloring material used in the related art for thermal transfer can be used together. For the coloring material to be used together, a hue, printing sensitivity, light fastness, preservability, and solubility to the binder resin are required to be taken into consideration. The amount of the coloring material used is 1 part by mass or more and 150 parts by mass or less, with respect to 100 parts by mass of the binder resin contained in the coloring material layer. The amount of the coloring material used is preferably 50 parts by mass or more and 120 parts by mass or less, from the viewpoint of dispersibility of the coloring material in a dispersion liquid. When two or more coloring materials are mixed, a total mass thereof is preferably in the above range.

[Binder Resin]

The binder resin is not particularly limited, but a water-soluble resin such as a cellulose resin, a polyacrylic acid resin, a starch resin, or an epoxy resin; or an organic solvent soluble resin such as a polyacrylate resin, a polymethacrylate resin, a polystyrene resin, a polycarbonate resin, a polyether sulfone resin, a polyvinyl butyral resin, an ethyl cellulose resin, an acetyl cellulose resin, a polyester resin, an AS resin, or a phenoxy resin is preferably used. These resins may be used alone, or, if necessary, in combination of two or more thereof.

[Surfactant]

In order to impart sufficient lubricity to the sheet for heat-sensitive transfer recording of the present invention during heating of the thermal head (during printing), a surfactant may be added.

[Wax]

In order to impart sufficient lubricity to the sheet for heat-sensitive transfer recording of the present invention during non-heating of the thermal head, a wax may be added. Examples of the wax that can be added can include a polyethylene wax, a paraffin wax, and a fatty acid ester wax, but are not limited thereto.

In addition to the above additives, if necessary, an ultraviolet absorber, an antiseptic agent, an antioxidant, an antistatic agent, a viscosity modifier, and the like may be added to the sheet for heat-sensitive transfer recording of the present invention.

[Medium]

When the coloring material layer is formed, the medium used for preparing a dispersion is not particularly limited, but examples thereof can include water and an organic solvent. As the organic solvent, alcohols such as methanol, ethanol, isopropanol, and isobutanol; cellosolves such as methyl cellosolve and ethyl cellosolve; aromatic hydrocarbons such as toluene, xylene, and chlorobenzene; esters such as ethyl acetate and butyl acetate; ketones such as acetone, methyl ethyl ketone, methyl isobutyl ketone, and cyclohexanone; halogenated hydrocarbons such as methylene chloride, chloroform, and trichloroethylene; ethers such as tetrahydrofuran and dioxane; N,N-dimethylformamide, or N-methyl pyrrolidone is preferably used. These organic solvents may be used alone, or, if necessary, in combination of two or more thereof.

[Substrate]

Next, the substrate constituting the sheet for heat-sensitive transfer recording will be described. Any substrate may be used without particular limitation as long as it is a film that supports the coloring material layer and has a heat resistance and a strength to some extent, and a known substrate can be used. Examples thereof can include a polyethylene terephthalate film, a polyethylene naphthalate film, a polycarbonate film, a polyimide film, a polyamide film, an aramid film, a polystyrene film, a 1,4-polycyclohexylenedimethylene terephthalate film, a polysulfone film, a polypropylene film, a polyphenylene sulfide film, a polyvinyl alcohol film, cellophane, a cellulose derivative, a polyethylene film, a polyvinyl chloride film, a nylon film, capacitor paper, and paraffin paper. Among them, a polyethylene terephthalate film is preferable from the viewpoints of a mechanical strength, solvent resistance, and economic efficiency.

A thickness of the substrate is 0.5 µm or more and 50 µm or less, and preferably 3 µm or more and 10 µm or less, from the viewpoint of transferability.

In a case where a dye ink is applied on the substrate to form the coloring material layer, wettability and adhesiveness of a coating liquid are likely to be insufficient. Therefore, it is preferable that a surface (forming surface) of the substrate on which the coloring material layer is formed is subjected to an adhesion treatment, if necessary. The forming surface of the coloring material layer may be formed on one side or both sides of the substrate. The adhesion treatment is not particularly limited, but examples thereof can include an ozone treatment, a corona discharge treatment, an ultraviolet treatment, a plasma treatment, a low-temperature plasma treatment, a primer treatment, and a chemical reagent treatment. In addition, these treatments may be performed in combination.

The adhesion treatment of the substrate may be performed by coating an adhesive layer on the substrate. The adhesive layer is not particularly limited. For the adhesive layer, a fine particle formed of an organic material such as a polyester resin, a polystyrene resin, a polyacrylic acid ester resin, a polyamide resin, a polyether resin, a polyvinyl acetate resin, a polyethylene resin, a polypropylene resin, a polyvinyl chloride resin, a polyvinyl alcohol resin, or a polyvinyl butyral resin, a fine particle formed of an inorganic material such as silica, alumina, magnesium carbonate, magnesium oxide, or titanium oxide can be used.

Since the sheet for heat-sensitive transfer recording of the present invention contains the compound represented by General Formula (1), it is possible to provide a sheet for heat-sensitive transfer recording exhibiting a cyan color having excellent high chroma, high light fastness, and storage stability.

<Resist Composition for Color Filter and Color Filter>

Next, the resist composition for a color filter (hereinafter, referred to as a "resist composition of the present invention") according to the present invention will be described. The compound represented by General Formula (1) exhibits a cyan color having excellent high chroma, high light fastness, and storage stability. Therefore, the compound is preferably used to adjust a color tone of the resist composition for a color filter. In addition, by using the resist composition of the present invention, a color filter exhibiting a cyan color having excellent high chroma, high light fastness, and storage stability can be obtained.

The resist composition for a color filter of the present invention contains a binder resin, a medium, and the compound of the present invention as a coloring agent. The resist composition for a color filter of the present invention can be obtained as described below. The compound of the present invention and the binder resin are added to the medium while being stirred. In this case, if necessary, a polymerizable monomer, a polymerization initiator, a photoacid generator, and the like may be added. Thereafter, the material is stably dissolved or finely dispersed in the medium by applying a mechanical shearing force with a disperser, thereby obtaining the resist composition for a color filter of the present invention.

[Binder Resin]

As a binder resin that can be used in the resist composition of the present invention, any binder resin may be used as long as any one of a light irradiation portion and a light shielding portion can be dissolved by an organic solvent, an alkali aqueous solution, water, or a commercially available developer in an exposure process of pixel formation. Among them, a binder resin having a composition that can be developed by water or an alkali aqueous solution is preferable from the viewpoints of workability and easiness in a treatment after resist preparation.

As the binder resin, it is possible to use a binder resin obtained by copolymerizing a hydrophilic polymerizable monomer such as acrylic acid, methacrylic acid, N-(2-hydroxyethyl)acrylamide, N-vinyl pyrrolidone, or a polymerizable monomer having an ammonium salt, and a lipophilic polymerizable monomer such as an acrylic acid ester, a methacrylic acid ester, vinyl acetate, styrene, or N-vinyl carbazole at an appropriate mixing ratio by a known method. These binder resins are used in combination with a radical polymerizable monomer having an ethylenic unsaturated group, a cationic polymerizable monomer having an oxirane ring or an oxetane ring group, a radical generator, an acid generator, and a base generator. This kind of binder resin can be used as a negative-type resist composition in which only a light shielding portion is removed by development in order to reduce solubility of a material at an exposure portion to the developer by exposure.

In addition, a resin having a quinone diazide group which is cleaved by light to generate a carboxylic acid, a resin having a group which is cleaved by an acid, such as a tert-butyl carbonate ester of polyhydroxystyrene or tetrahydropyranyl ether, and an acid generator which generates an acid by exposure can be used in combination. This kind of resin can be used as a positive-type resist composition in which only an exposure portion is removed by development in order to improve solubility of a material in the developer at an exposure portion to the developer by exposure.

In a case where the resist composition of the present invention is the negative-type resist composition, a polymerizable monomer which performs addition polymerization by exposure (hereinafter, referred to as a "photopolymerizable monomer") is preferably used as the binder resin. As the photopolymerizable monomer, it is preferable to use a compound having at least one addition-polymerizable ethylenic unsaturated double bond in a molecule and having a melting point of 100° C. or higher at a normal pressure. Specifically, examples of thereof can include monofunctional acrylates and methacrylates such as polyethylene glycol monoacrylate, polyethylene glycol monomethacrylate, polypropylene glycol monoacrylate, polypropylene glycol monomethacrylate, phenoxyethyl acrylate, and phenoxyethyl methacrylate; polyfunctional acrylates and methacrylates such as polyethylene glycol diacrylate, polyethylene glycol dimethacrylate, polypropylene glycol diacrylate, polypropylene glycol dimethacrylate, trimethylolethane triacrylate, trimethylolethane trimethacrylate, trimethylolpropane triacrylate, trimethylolpropane trimethacrylate, trimethylolpropane diacrylate, trimethylolpropane dimethacrylate, neopentyl glycol diacrylate, neopentyl glycol dimethacrylate, pentaerythritol tetraacrylate, pentaerythritol tetramethacrylate, pentaerythritol triacrylate, pentaerythritol trimethacrylate, dipentaerythritol hexaacrylate, dipentaerythritol hexamethacrylate, dipentaerythritol pentaacrylate, dipentaerythritol pentamethacrylate, hexanediol diacrylate, hexanediol dimethacrylate, trimethylolpropane tri(acryloyloxy propyl)ether, tri(acryloyloxy ethyl)isocyanurate, tri(acryloyloxy ethyl)cyanurate, glycerol triacrylate, and glycerol trimethacrylate; and polyfunctional acrylates and polyfunctional methacrylates that can be obtained by adding ethylene oxide or propylene oxide to a polyfunctional alcohol such as trimethylol propane or glycerol, and then performing acrylation or methacrylation. Furthermore, it is possible to use urethane acrylates, polyester acrylates, or polyfunctional epoxy acrylates or epoxy methacrylates which are reaction products of an epoxy resin and acrylic acid or methacrylic acid.

Among the above photopolymerizable monomers, it is preferable to use trimethylolpropane triacrylate, trimethylolpropane trimethacrylate, pentaerythritol tetraacrylate, pentaerythritol tetramethacrylate, dipentaerythritol hexaacrylate, dipentaerythritol hexamethacrylate, dipentaerythritol pentaacrylate, or dipentaerythritol pentamethacrylate. The photopolymerizable monomers may be used alone, or, if necessary, in combination of two or more thereof.

A content of the photopolymerizable monomer is preferably 5 mass % or more and 50 mass % or less, and more preferably 10 mass % or more and 40 mass % or less, with respect to a mass (total solid content) of the resist composition according to the present invention. When the content is 5 mass % or more and 50 mass % or less, the sensitivity to exposure can be further improved, and adhesion of the resist composition is also improved.

In a case where the resist composition of the present invention is the negative-type resist composition, a photopolymerization initiator may also be added. Examples of the photopolymerization initiator can include a vicinal polyketo aldol compound, an α-carbonyl compound, an acyloin ether, a multi-branched quinone compound, a combination of a triallyl imidazole dimer and p-aminophenyl ketone, and a tri-oxadiazole compound. Among them, 2-benzyl-2-dimethylamino-1-(4-morpholinophenyl)butanone (trade name: Irgacure 369, manufactured by BASF SE) is preferable. When the pixel is formed by using the resist composition of the present invention, in a case where an electron beam is used, the photopolymerization initiator is not necessarily required.

In addition, in a case where the resist composition of the present invention is the positive-type resist composition, a photoacid generator may be added, if necessary. As the photoacid generator, a known photoacid generator such as a salt of an onium ion such as a sulfonium, iodonium, selenium, ammonium, or phosphonium ion, and an anion can be used.

Examples of the sulfonium ion can include triphenylsulfonium, tri-p-tolylsulfonium, tri-o-tolylsulfonium, tris(4-methoxyphenyl)sulfonium, 1-naphthyldiphenylsulfonium, diphenylphenacylsulfonium, phenylmethylbenzylsulfonium, 4-hydroxyphenylmethylbenzylsulfonium, dimethylphenacylsulfonium, and phenacyltetrahydrothiophenium.

Examples of the iodonium ion can include diphenyliodonium, di-p-tolyliodonium, bis(4-dodecylphenyl)iodonium, bis(4-methoxyphenyl)iodonium, and (4-octyloxyphenyl)phenyliodonium.

Examples of the selenium ion can include triarylselenium such as triphenylselenium, tri-p-tolylselenium, tri-o-tolylselenium, tris(4-methoxyphenyl)selenium, 1-naphthyldiphenylselenium, tris(4-fluorophenyl)selenium, tri-1-naphtylselenium, or tri-2-naphthylselenium.

Examples of the ammonium ion can include tetraalkylammonium such as tetramethylammonium, ethyltrimethylammonium, diethyldimethylammonium, triethylmethylammonium, tetraethylammonium, trimethyl-n-propylammonium, trimethylisopropylammonium, trimethyl-n-butylammonium, or trimethylisobutylammonium.

Examples of the phosphonium ion can include tetraphenylphosphonium, tetra-p-tolylphosphonium, tetrakis(2-methoxyphenyl)phosphonium, triphenylbenzylphosphonium, triphenylphenacylphosphonium, triphenylmethylphosphonium, triethylbenzylphosphonium, and tetraethylphosphonium.

Examples of the anion can include a perhalogen acid ion such as $ClO_4^-$ or $BrO_4^-$; a halogenated sulfonic acid ion such as $FSO_3^-$ or $ClSO_3^-$; a sulfuric acid ion such as $CH_3SO_4^-$, $CF_3SO_4^-$, or $HSO_4^-$; a carbonic acid ion such as $HCO_3^-$ or $CH_3CO_3^-$; an aluminic acid ion such as $AlCl_4^-$ or $AlF_4^-$; a hexafluoro bismuthic acid ion; a carboxylic acid ion such as $C_3COO^-$, $CF_3COO^-$, $C_6H_5COO^-$, $C_3C_6H_4COO^-$, $C_6F_5COO^-$, or $CF_3C_6H_4COO^-$; an aryl boric acid ion such as $B(C_6H_5)_4^-$ or $C_3C_2C_2C_2B(C_6H_5)_3^-$; a thiocyanate ion; and a nitric acid ion, but are not limited thereto.

[Medium]

In the resist composition of the present invention, as the medium used to dissolve or disperse the compound of the present invention, the binder resin, and the photopolymerizable monomer, the photopolymerization initiator, and the photoacid generator to be added, if necessary, water or an organic solvent can be used. Examples of the organic solvent can include cyclohexanone, ethyl cellosolve acetate, butyl cellosolve acetate, 1-methoxy-2-propyl acetate, diethylene glycol dimethyl ether, ethylbenzene, 1,2,4-trichlorobenzene, ethylene glycol diethyl ether, xylene, ethyl cellosolve, methyl-n-amyl ketone, propylene glycol monomethyl ether, toluene, methyl ethyl ketone, ethyl acetate, methanol, ethanol, isopropanol, butanol, methyl isobutyl ketone, and a petroleum solvent. These organic solvents may be used alone, or in combination of two or more thereof.

[Coloring Agent]

In the coloring agent constituting the resist composition of the present invention, although the compound represented by General Formula (1) is used, the compounds may be used alone, or in combination of two or more thereof. In addition, in order to obtain desired spectral characteristics, another dye may be used together for color tone adjustment. The dye that can be used together is not particularly limited, but examples thereof can include a condensed azo compound, an azo metal complex, a diketo pyrrolo pyrrole compound, an anthraquinone compound, a quinacridone compound, a naphthol compound, a benzimidazolon compound, a thioindigo compound, a perylene compound, a methine compound, an allylamide compound, and a base dye lake compound.

In addition to the additive, to the resist composition for a color filter of the present invention, an ultraviolet absorber or a silane coupling agent which is used to improve the adhesion to a glass substrate in production of a filter may be added, if necessary.

The disperser is not particularly limited, but a media type disperser such as a rotating shear type homogenizer, a ball mill, a sand mill, or an attritor, or a high-pressure counter collision type disperser can be used.

As described above, since the resist composition for a color filter of the present invention contains the compound represented by General Formula (1), it is possible to obtain a resist composition for a color filter exhibiting a cyan color having excellent high chroma, high light fastness, and storage stability. In a color filter in which two or more kinds of pixels having different spectral characteristics are arranged adjacent to each other, when the resist composition of the present invention is used for a pixel which forms at least one color among a plurality of pixel colors (for example, red, green, and blue), a color filter exhibiting a cyan color having excellent high chroma, high light fastness, and storage stability can be obtained.

<Toner>

Next, the toner according to the present invention will be described. Since the compound of the present invention exhibits a cyan color having excellent high chroma, high light fastness, and storage stability, the compound can be preferably used for the toner.

The toner of the present invention contains a mixture of a pigment for a toner used in the related art as a coloring agent and the compound represented by General Formula (1), a binder resin, and if necessary, a magnetic material, a wax, a charge control agent, and other additives. Examples of a method of producing a toner particle constituting the toner of the present invention can include a pulverization method, a suspension polymerization method, a suspension granulation method, an emulsion polymerization method, and an emulsion aggregation method. In addition, the toner of the present invention can also be used as a developer used in a liquid development method. Among them, the toner of the present invention in which the compound represented by General Formula (1) is used as a coloring agent is preferably a pulverized toner produced by a pulverization method.

In the coloring agent, although the compound represented by General Formula (1) is used, the compounds may be used alone, or in combination of two or more thereof. In addition, in order to adjust tone or the like according to the method of producing a toner, a known pigment or dye can be used together. Next, an example of the method of producing a pulverized toner will be described.

[Method of Producing Pulverized Toner]

A coloring agent or the like is melted and kneaded in a binder resin and then uniformly dispersed, the melted and kneaded product is cooled and solidified, the kneaded product is finely pulverized with a fine pulverizer, and the finely pulverized product is classified with a classifier to obtain a toner particle having a desired particle diameter, thereby producing a pulverized toner. Specifically, first, the compound represented by General Formula (1) as a coloring agent, a binder resin, and if necessary, a material such as a magnetic material, a wax, a charge control agent, or other additives are sufficiently mixed with each other with a mixer such as a Henschel mixer or a ball mill. Subsequently, the mixture is melted with a thermal kneader such as a roll, a kneader, or an extruder. Furthermore, the resins are dissolved to each other by kneading and then dispersed by adding a wax or a magnetic material, if necessary. In addition, a pulverized toner can be obtained by performing cooling and solidification and then performing pulverization and classification. In the production of the pulverized toner, a known production apparatus such as a mixer, a thermal kneader, or a classifier can be used. Hereinafter, the respective components constituting the toner will be described.

[Coloring Agent]

In the coloring agent, a pigment (for example, C.I. Pigment Blue 15:3 or the like) for a toner used in the related art and the compound represented by General Formula (1) are used. As described above, these compounds may be used alone, or in combination of two or more thereof. In addition, if necessary, a coloring agent such as a known dye or pigment can be used together.

The compound represented by General Formula (1) can be used in a range of 0.01 times by mass or more and 1.0 times by mass or less, preferably in a range of 0.03 times by mass or more and 0.5 times by mass or less, and in particular, in a range of 0.05 times by mass or more and 0.2 times by mass or less, with respect to the pigment.

In addition, the coloring agent that can be used together is not particularly limited, but examples thereof can include a condensed azo compound, an azo metal complex, a diketo pyrrolo pyrrole compound, an anthraquinone compound, a quinacridone compound, a naphthol compound, a benzimidazolon compound, a thioindigo compound, a perylene compound, a methine compound, an allylamide compound, and a base dye lake compound.

[Binder Resin]

Examples of the binder resin used in the toner of the present invention can include a vinyl-based resin, a polyester-based resin, an epoxy-based resin, a polyurethane-based resin, a polyvinyl butyral-based resin, a terpene-based resin, a phenolic resin, an aliphatic or alicyclic hydrocarbon resin, and an aromatic petroleum resin, and furthermore, examples thereof can include a rosin and a modified rosin. Among them, a vinyl-based resin and a polyester-based resin are preferable from the viewpoint of chargeability or fixability. When the polyester-based resin is used, the effect of chargeability or fixability is further enhanced, which is more preferable. These resins may be used alone, or in combination of two or more thereof. When two or more resins are used in combination, in order to control viscoelastic properties of the toner, resins having different molecular weights are preferably mixed with each other.

A glass transition temperature (Tg) of the binder resin is preferably 45° C. or higher and 80° C. or lower, and more preferably 55° C. or higher and 70° C. or lower. In addition, a number average molecular weight (Mn) of the binder resin is preferably 1,500 or more and 50,000 or less, and a weight average molecular weight (Mw) of the binder resin is preferably 6,000 or more and 1,000,000 or less.

When a polyester-based resin is used as a binder resin, although it is not particularly limited, but a molar ratio of an alcohol component/an acid component in the entire component is preferably 45/55 to 55/45. In the polyester-based resin, when the number of terminal groups of molecular chains is increased, an environmental dependence of the chargeability of the toner is increased. Therefore, an acid value is preferably 90 mgKOH/g or less, and more preferably 50 mgKOH/g or less. In addition, a hydroxyl value is preferably 50 mgKOH/g or less, and more preferably 30 mgKOH/g or less.

[Wax]

To the toner of the present invention, if necessary, a wax may be added. Examples of the wax can include a polyethylene wax, a paraffin wax, and a fatty acid ester wax, but are not limited thereto.

[Charge Control Agent]

To the toner of the present invention, if necessary, a charge control agent may be added. The charge control agent is not particularly limited, but examples of a charge control agent which controls the toner to have a negative charge can include a polymer or a copolymer having a sulfonic acid group, a sulfonic acid salt group, or a sulfonic acid ester group, a salicylic acid derivative or metal complexes thereof, a monoazo metal compound, an acetylacetone metal compound, an aromatic oxycarboxylic acid, an aromatic mono- or polycarboxylic acid or metal salts, anhydrides, and esters thereof, a phenol derivative such as bisphenol, a urea derivative, a metal-containing naphthoic acid-based compound, a boron compound, a quaternary ammonium salt, a calixarene, and a resin-based charge control agent.

In addition, examples of a charge control agent which controls the toner to have a positive charge can include nigrosine and a nigrosine-modified product with a fatty acid metal salt, a guanidine compound, an imidazole compound, a quaternary ammonium salt such as tributylbenzylammonium-1-hydroxy-4-naphthosulfonate or tetrabutylammonium tetrafluoroborate, and an onium salt such as a phosphonium salt which is an analogue thereof and lake pigments thereof, a triphenylmethane dye and lake pigments thereof (as a laking agent, for example, phosphotungstic acid, phosphomolybdic acid, phosphotungstic molybdic acid, tannic acid, lauric acid, gallic acid, ferricyanide, and ferrocyanide), a metal salt of higher fatty acid, diorganotin oxide such as dibutyl tin oxide, dioctyl tin oxide, or dicyclohexyl tin oxide, diorganotin borates such as dibutyl tin borate, dioctyl tin borate, and dicyclohexyl tin borate, and a resin-based charge control agent. These charge control agents may be used alone, or in combination of two or more thereof.

EXAMPLES

Hereinafter, although the present invention will be described in more detail with reference to examples and comparative example, the present invention is not limited to these examples. In the description, "part(s)" represents "part (s) by mass" unless otherwise stated. In addition, the identification of an obtained compound was performed using a $^1$H nuclear magnetic resonance spectroscopic analysis ($^1$H-NMR) apparatus (AVANCE-600 NMR spectrometer or AVANCE-500 NMR spectrometer, manufactured by BRUKER) and a high-speed liquid chromatography mass spectrometer (LCMS-2010, manufactured by Shimadzu Corporation).

Production Example 1

Production of Compound (1-4)

A mixed solution in which 48 mL of acetic acid of a triazole compound (A-1) (5.00 g, 18.4 mmol), 12 mL of water, and 12 mL of concentrated hydrochloric acid were included was cooled at 0° C., 2 mL of water containing sodium nitrite (1.27 g, 18.4 mmol) was slowly added dropwise thereto so as to maintain the temperature at 5° C. or lower, and stirring was performed at 0 to 5° C. for 1 hour. The temperature was further raised up to room temperature, and then stirring was performed for 1 hour. The precipitated solid was filtered and washed with 200 mL of water, thereby obtaining a nitroso compound (4.06 g, yield: 73.4%).

A thiazole compound (C-9) (1.53 g, 3.7 mmol) was added to 100 mL of a chloroform solution containing the obtained nitroso compound (1.10 g, 3.7 mmol), and then stirring was performed at room temperature for 24 hours. The reaction was terminated, and then the solvent was concentrated at a reduced pressure, thereby obtaining a compound (1-4) (1.63 g, 63.3%) purified by using silica gel column chromatography (development solvent: ethyl acetate/heptane). The compound (1-4) was identified by a $^1$H-NMR analysis and a mass analysis. A $^1$H-NMR spectrum in CDCl$_3$, room temperature, and 500 MHz of the compound (1-4) is illustrated in the FIGURE.

[Analysis Result of Compound (1-4)]

[1] $^1$H-NMR (500 MHz, CDCl$_3$, room temperature): δ (ppm)=0.81-0.96 (20H, m), 1.23-1.37 (16H, m), 1.52-2.05 (8H, m), 2.46 (3H, d, J=4.0 Hz), 2.50 (3H, d, J=4.5 Hz), 2.92-3.00 (1H, br), 3.50 (2H, s), 3.79 (2H, br), 3.92 (2H, br), 7.30 (2H, dd, J=4.0 Hz), 7.96 (2H, dd, J=4.5 Hz)

[2] Mass analysis (LCMS-2010): m/z=698.50 (M+H)$^+$

Production Example 2

Production of Compound (1-5)

A compound (1-5) was produced and identified in the same manner as that of Production Example 1, except that the triazole compound (A-1) and the thiazole compound (C-4) were used.
[Analysis Result of Compound (1-5)]
[1] $^1$H-NMR (500 MHz, CDCl$_3$, room temperature): δ (ppm)=0.80-0.95 (13H, m), 1.11-1.49 (19H, m), 1.58 (3H, s), 1.71-1.90 (9H, m), 2.49 (3H, d, J=4.2 Hz), 2.53 (3H, d, J=4.2 Hz), 2.91-3.02 (1H, br), 3.57-3.61 (2H, d, J=6.5 Hz), 4.01 (2H, d, J=7.0 Hz), 4.30 (2H, m), 3.94-3.97 (2H, m), 7.33 (2H, t, J=6.6 Hz), 7.99 (2H, dd, J=6.0, 3.6 Hz)
[2] Mass analysis (LCMS-2010): m/z=698.55 (M+H)$^+$ Production Example 3

Production of Compound (1-8)

A compound (1-8) was produced and identified in the same manner as that of Production Example 1, except that the triazole compound (A-9) and the thiazole compound (C-9) were used.
[Analysis Result of Compound (1-8)]
[1] $^1$H-NMR (600 MHz, CDCl$_3$, room temperature): δ (ppm)=0.82 (3H, t, J=7.2 Hz), 0.89-0.97 (13H, m), 1.31-1.40 (13H, m), 1.48 (6H, s), 1.60 (2H, s), 1.87 (2H, d, J=7.8 Hz), 1.95 (2H, br), 2.08 (2H, br), 2.48 (3H, s), 2.53 (3H, s), 3.54 (2H, d, J=5.4 Hz), 3.89 (1H, br), 3.94 (1H, br), 7.33 (2H, d, J=8.4 Hz), 7.98 (2H, d, J=8.4 Hz)
[2] Mass analysis (LCMS-2010): m/z=670.50 (M+H)$^+$ Production Example 4

Production of Compound (1-9)

A compound (1-9) was produced and identified in the same manner as that of Production Example 1, except that the triazole compound (A-7) and the thiazole compound (C-9) were used.
[Analysis Result of Compound (1-9)]
[1] $^1$H-NMR (600 MHz, CDCl$_3$, room temperature): δ (ppm)=0.88-0.96 (14H, m), 1.26-1.41 (12H, m), 1.52 (9H, s), 1.63 (2H, br), 1.95 (2H, br), 2.08 (2H, br), 2.48 (3H, s), 2.53 (3H, s), 3.90-3.56 (2H, m), 7.33 (2H, d, J=8.4 Hz), 7.99 (2H, d, J=7.8 Hz)
[2] Mass analysis (LCMS-2010): m/z=656.45 (M+H)$^+$ Production Example 5

Production of Compound (1-11)

A compound (1-11) was produced and identified in the same manner as that of Production Example 1, except that the triazole compound (A-8) and the thiazole compound (C-9) were used.
[Analysis Result of Compound (1-11)]
[1] $^1$H-NMR (600 MHz, CDCl$_3$, room temperature): δ (ppm)=0.89-0.99 (12H, m), 1.28-1.46 (16H, m), 1.58 (4H, s), 1.69-1.88 (4H, m), 1.91-1.99 (1H, br), 2.00-2.10 (1H, br), 2.12-2.20 (2H, m), 2.48 (3H, s), 2.52 (3H, s), 2.92-3.02 (1H, m), 3.55 (2H, t, J=3 Hz), 3.80-3.89 (1H, m), 3.97-4.03 (1H, m), 7.33 (2H, d, J=7.8 Hz), 7.99 (2H, d, J=8.4 Hz)
[2] Mass analysis (LCMS-2010): m/z=682.50 (M+H)$^+$ Production Example 6

Production of Compound (1-12)

A compound (1-12) was produced and identified in the same manner as that of Production Example 1, except that the triazole compound (A-5) and the thiazole compound (C-9) were used.
[Analysis Result of Compound (1-12)]
[1] $^1$H-NMR (500 MHz, CDCl$_3$, room temperature): δ (ppm)=0.99-1.05 (12H, m), 1.16 (9H, s), 1.39-1.49 (11H, m), 1.90-2.10 (2H, m), 2.55 (3H, s), 2.59 (3H, s), 2.88 (2H, s), 3.58 (2H, d, J=7.0 Hz), 3.81-4.22 (2H, m), 7.39 (2H, d, J=8.0 Hz), 8.05 (2H, d, J=7.5 Hz)
[2] Mass analysis (LCMS-2010): m/z=670.60 (M+H)$^+$ Production Example 7

Production of Compound (1-13)

A compound (1-13) was produced and identified in the same manner as that of Production Example 1, except that the triazole compound (A-1) and the thiazole compound (C-10) were used.
[Analysis Result of Compound (1-13)]
[1] $^1$H-NMR (500 MHz, CDCl$_3$, room temperature): δ (ppm)=0.81-0.96 (12H, m), 1.12-1.45 (16H, m), 1.50-2.05 (8H, m), 2.50 (3H, d, J=4.0 Hz), 2.54 (3H, d, J=4.0 Hz), 2.83-3.00 (3H, br), 3.80 (2H, br), 7.35 (2H, dd, J=4.5 Hz), 8.01 (2H, dd, J=3.5 Hz)
[2] Mass analysis (LCMS-2010): m/z=638.40 (M+H)$^+$ Production Example 8

Production of Compound (1-15)

A compound (1-15) was produced and identified in the same manner as that of Production Example 1, except that the triazole compound (A-1) and the thiazole compound (C-13) were used.
[Analysis Result of Compound (1-15)]
[1] $^1$H-NMR (600 MHz, CDCl$_3$, room temperature): δ (ppm)=0.83-0.98 (20H, m), 1.27-1.40 (12H, m), 1.85-2.09 (6H, m), 2.52 (3H, s), 2.96 (1H, s), 3.53 (2H, d, J=2.4 Hz), 3.87 (2H, br), 3.96 (2H, br), 7.50 (2H, d, J=8.4 Hz), 8.00 (2H, d, J=8.4 Hz)
[2] Mass analysis (LCMS-2010): m/z=718.60 (M+H)$^+$ Production Example 9

Production of Compound (1-17)

A compound (1-17) was produced and identified in the same manner as that of Production Example 1, except that the triazole compound (A-1) and the thiazole compound (C-16) were used.
[Analysis Result of Compound (1-17)]
[1] $^1$H-NMR (600 MHz, CDCl$_3$, room temperature): δ (ppm)=0.85-0.97 (20H, m), 1.25-1.41 (16H, m), 1.59-1.68 (2H, br), 1.70-2.10 (6H, m), 2.52 (3H, s), 3.98 (1H, d, J=7.2 Hz), 3.54 (2H, d, J=7.2 Hz), 3.72-4.00 (2H, m), 3.88 (3H, s) 7.14 (1H, m), 7.44 (1H, t, J=7.8 Hz), 7.57 (1H, t, J=2.1 Hz), 7.63 (1H, t, J=3.9 Hz)

[2] Mass analysis (LCMS-2010): m/z=714.55 (M+H)$^+$

Production Example 10

Production of Compound (1-18)

A compound (1-18) was produced and identified in the same manner as that of Production Example 1, except that the triazole compound (A-6) and the thiazole compound (C-9) were used.

[Analysis Result of Compound (1-18)]

[1] $^1$H-NMR (500 MHz, CDCl$_3$, room temperature): δ (ppm)=0.95-1.02 (12H, m), 1.31-1.43 (11H, m), 1.64 (5H, s), 2.01 (2H, d, J=5.5 Hz), 2.53 (2H, s), 2.57 (2H, s), 3.49 (2H, s), 3.61 (2H, d, J=6.5 Hz), 4.01 (2H, d, J=7.0 Hz), 4.30 (2H, d, J=6.5 Hz), 7.26-7.28 (3H, m), 7.31-7.36 (2H, m), 7.46 (2H, t, J=13.5 Hz), 8.03 (2H, t, J=14.5 Hz)

[2] Mass analysis (LCMS-2010): m/z=690.45 (M+H)$^+$

Production Example 11

Production of Compound (1-21)

A compound (1-21) was produced and identified in the same manner as that of Production Example 1, except that the triazole compound (A-11) and the thiazole compound (C-9) were used.

[Analysis Result of Compound (1-21)]

[1] $^1$H-NMR (600 MHz, CDCl$_3$, room temperature): δ (ppm)=0.88-0.97 (12, m), 1.31-1.47 (22H, m), 1.49 (6H, s), 1.95-1.96 (2H, br), 2.07-2.08 (2H, br), 2.49 (3H, s), 2.53 (3H, s), 3.30-3.32 (1H, m), 3.54-3.56 (2H, m), 3.92-3.97 (2H, m), 7.34 (2H, d, J=8.4 Hz), 8.04 (2H, d, J=7.8 Hz)

[2] Mass analysis (LCMS-2010): m/z=669.65 (M+H)$^+$

Production Example 12

Production of Compound (1-22)

A compound (1-22) was produced and identified in the same manner as that of Production Example 1, except that the triazole compound (A-12) and the thiazole compound (C-9) were used.

[Analysis Result of Compound (1-22)]

[1] $^1$H-NMR (600 MHz, CDCl$_3$, room temperature): δ (ppm)=0.83-0.96 (12H, m), 1.25-1.41 (16H, m), 1.95 (1H, br), 2.05 (1H, br), 2.49 (3H, s), 2.53 (3H, s), 3.24 (4H, d, J=3 Hz), 3.53 (2H, q, J=3 Hz), 3.82-3.91 (1H, br), 3.98-4.04 (1H, br), 7.20-7.28 (5H, m), 7.34 (2H, d, J=8.4 Hz), 8.05 (2H, d, J=6 Hz)

[2] Mass analysis (LCMS-2010): m/z=703.65 (M+H)$^+$

Production Example 13

Production of Compound (1-23)

A compound (1-23) was produced and identified in the same manner as that of Production Example 1, except that the triazole compound (A-13) and the thiazole compound (C-9) were used.

[Analysis Result of Compound (1-23)]

[1] $^1$H-NMR (600 MHz, CDCl$_3$, room temperature): δ (ppm)=0.88-0.98 (19H, m), 1.30-1.41 (14H, m), 1.81-1.88 (5H, m), 1.95 (1H, br), 2.08 (1H, m), 2.49 (3H, s), 5.53 (3H, s), 2.88-2.93 (1H, m), 3.54 (2H, q, J=3 Hz), 3.78-3.92 (1H, m), 3.95-4.00 (1H, m), 7.33 (2H, d, J=7.8 Hz), 8.01 (2H, d, J=8.4 Hz)

[2] Mass analysis (LCMS-2010): m/z=669.45 (M+H)$^+$

Production Example 14

Production of Compound (1-24)

A compound (1-24) was produced and identified in the same manner as that of Production Example 1, except that the triazole compound (A-14) and the thiazole compound (C-9) were used.

[Analysis Result of Compound (1-24)]

[1] $^1$H-NMR (600 MHz, CDCl$_3$, room temperature): δ (ppm)=[1]$^1$H-NMR (600 MHz, CDCl$_3$, room temperature): δ (ppm)=0.89-1.98 (19H, m), 1.31-1.46 (14H, m), 1.65-1.79 (2H, m), 1.81 (2H, d, J=7.8 Hz), 1.85 (1H, s), 2.04 (1H, s), 2.48 (3H, s), 2.52 (3H, s), 2.89-2.92 (2H, m), 3.54 (2H, t, J=5.4 Hz), 3.87 (1H, br), 4.00 (1H, br), 7.33 (2H, d, J=7.8 Hz), 7.99 (2H, d, J=7.2 Hz)

[2] Mass analysis (LCMS-2010): m/z=669.55 (M+H)$^+$

<Production of Ink>

An ink of the present invention and a comparative ink were produced by the following method.

Example 1

Production of Ink (1)

Five parts of a polyvinyl butyral resin (Denka 3000-K, manufactured by Denka Company Limited) were slowly added to and dissolved in a mixed solution of 45 parts of methyl ethyl ketone/45 parts of toluene. Five parts of the compound (1-4) synthesized in Production Example 1 were added to and dissolved in the mixed solvent, thereby obtaining a cyan ink (1).

Examples 2 to 14

Production of Inks (2) to (14)

Inks (2) to (14) were produced in the same manner as that of Example 1, except that, in Example 1, the compound (1-4) was changed to compounds shown in Table 1.

Comparative Examples 1 to 5

Production of Comparative Inks (1) to (5)

Comparative inks (1) to (5) were produced in the same manner as that of Example 1, except that, in Example 1, the compound (1-4) was changed to the following comparative compounds (D-1) to (D-5).

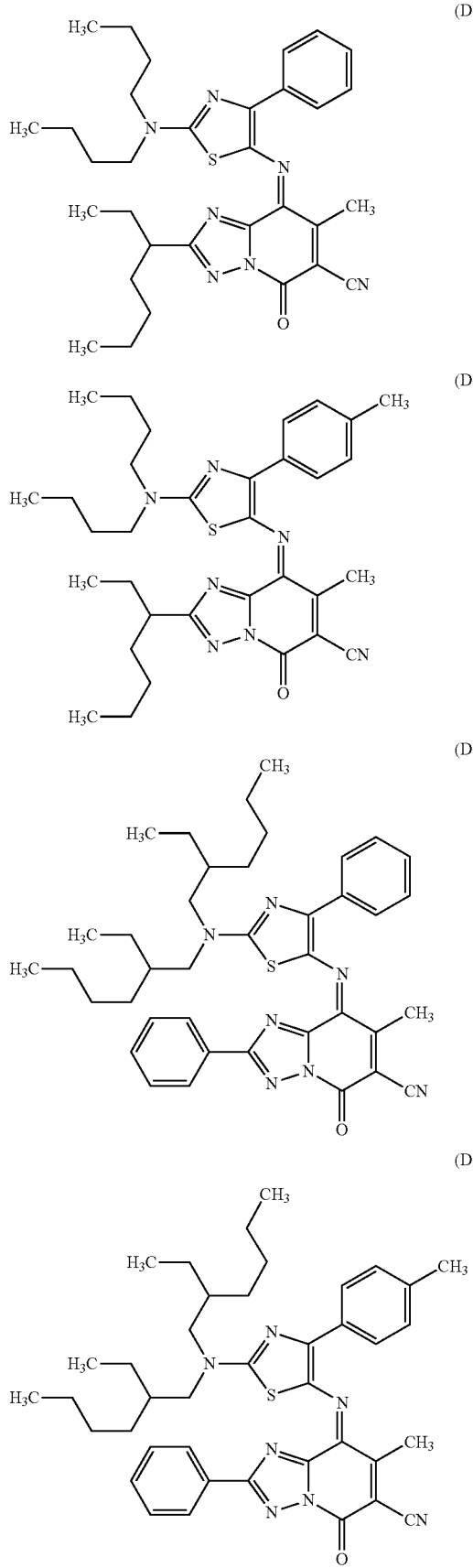

(D-1)
(D-2)
(D-3)
(D-4)

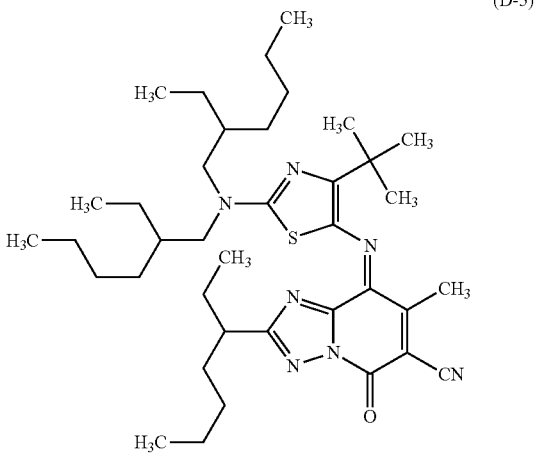

(D-5)

[Preparation of Sheet for Heat-Sensitive Transfer Recording and Image Sample]

The cyan ink (1) was applied to a polyethylene terephthalate film having a thickness of 4.5 μm (Lumirror (registered trademark), manufactured by TORAY INDUSTRIES, INC.) to have a thickness of 1 μm after drying and then dried, thereby preparing a sheet for heat-sensitive transfer recording by using the ink of the present invention.

The formed sheet for heat-sensitive transfer recording was transferred onto photographic paper by using a modified Selphy, thereby preparing an image sample (1).

[Chroma Evaluation]

The chromaticity (L*, a*, and b*) of each of the prepared image samples in a L*a*b* color system was measured with a spectral densitometer (fluorescence spectral densitometer FD-7, manufactured by KONICA MINOLTA, INC.), and the chroma (C*) was calculated by the following equation.

$$C^* = \sqrt{(a^*)^2 + (b^*)^2}$$

As the chroma C* and the brightness L* are both larger, extension of the chroma becomes preferable, which means high chroma. The results are shown in Table 1.

The evaluation criteria are as follows.

A: L* is 50.0 or more, and C* is 65.0 or more.
B: L* is 40.0 or more and less than 50.0, and C* is 65.0 or more.
C: L* is less than 40.0, or C* is less than 65.0.

A level of B or higher was determined as a level at which the effects of the present invention were obtained.

[Hue Evaluation]

A hue was evaluated by the chromaticity (L*, a*, and b*). The evaluation criteria of the tone are as follows.

A: The hue exists in a portion obtained by connecting the original point, (a*,b*)=(−50, −50), and (a*,b*)=(−45, −80), on the ab plane.
B: The hue exists in a portion obtained by connecting the original point, (a*,b*)=(−50, −50), and (a*,b*)=(−40, −80), on the ab plane.
C: Other hues except for A and B above A level of B or higher was determined as a level at which the effects of the present invention were obtained.

[Evaluation of Storage Stability of Ink]

The ink of the example was sealed and stored at 10° C. for one month, and then the presence or absence of an aggregate after storage was visually observed. The results are shown in Table 1.

The evaluation criteria are as follows.
A: Almost no aggregate of the compound was observed (very excellent in the storage stability).
B: A small amount of aggregate of the compound was observed (excellent in the storage stability).
C: A considerable amount of aggregate of the compound was observed (inferior in the storage stability).

[Light Fastness Evaluation]

The image sample was injected to a xenon tester (Atlas Weather-Ometer Ci4000, manufactured by Toyo Seiki Seisaku-sho, Ltd.), and then exposed under conditions (illuminance: 0.28 W/m² at 340 nm, black panel temperature: 40° C., and relative humidity: 50%) for 5 hours. When an initial optical concentration was set as $OD_0$ and O.D. after the exposure for 5 hours was set as $OD_5$, an O.D. residual rate was defined as follows.

O.D. residual rate (%)=($OD_5$/$OD_0$)×100

The evaluation criteria are as follows.
A: 85≤O.D. residual rate (%)
B: 70≤O.D. residual rate (%)<85
C: O.D. residual rate (%)<70

The obtained results are shown in Table 1. When the O.D. residual rate was more than 50, it was determined as a level at which the effects of the present invention were obtained.

sition (weight average molecular weight Mw: 10,000) containing, at a monomer ratio, 40 mass % of n-butyl methacrylate, 30 mass % of acrylic acid, and 30 mass % of hydroxyethyl methacrylate, 1.3 parts of dipentaerythritol pentaacrylate, and 0.4 parts of 2-benzyl-2-dimethylamino-1-(4-morpholinophenyl)-butanone (photopolymerization initiator) were included, and stirring was performed at room temperature for 3 hours. The mixture was filtered with a 1.5 μm filter, thereby obtaining a resist composition (1) for a color filter.

The resist composition (1) for a color filter was spin-coated on a glass substrate and dried at 90° C. for 3 minutes, the entire surface was exposed and then subjected to post curing at 180° C., thereby producing a color filter (1).

Examples 16 to 21

Resist compositions (2) to (7) for a color filter were obtained in the same manner as that of Example 15, except that, the compound (1-4) was changed to compounds shown in Table 2. In addition, color filters (2) to (7) were produced in the same operation as that of Example 15, except that the obtained resist compositions (2) to (7) for a color filter were used instead of the resist composition (1) for a color filter.

TABLE 1

| | Compound | Use | C* | L* | Chroma evaluation | a* | b* | Cyan color | Aggregation property | OD residual rate after 5 hours | Light fastness |
|---|---|---|---|---|---|---|---|---|---|---|---|
| Example 1 | 1-4 | Ink (1) | 66.9 | 60.3 | A | −43.6 | −50.7 | A | A | 87% | A |
| Example 2 | 1-5 | Ink (2) | 68.0 | 54.9 | A | −34.6 | −58.5 | A | A | 86% | A |
| Example 3 | 1-8 | Ink (3) | 67.3 | 57.7 | A | −38.9 | −54.9 | A | A | 80% | A |
| Example 4 | 1-9 | Ink (4) | 67.1 | 57.5 | A | −38.1 | −55.2 | A | A | 84% | A |
| Example 5 | 1-11 | Ink (5) | 65.9 | 59.2 | A | −38.8 | −53.2 | A | B | 73% | B |
| Example 6 | 1-12 | Ink (6) | 66.1 | 60.7 | A | −41.8 | −51.2 | A | A | 86% | A |
| Example 7 | 1-13 | Ink (7) | 66.4 | 62.6 | A | −42.5 | −51.0 | A | A | 72% | B |
| Example 8 | 1-15 | Ink (8) | 65.8 | 62.0 | A | −37.2 | −54.2 | A | A | 89% | A |
| Example 9 | 1-17 | Ink (9) | 66.1 | 54.7 | A | −44.0 | −49.4 | A | A | 93% | A |
| Example 10 | 1-18 | Ink (10) | 67.2 | 58.1 | A | −42.8 | −51.8 | A | A | 78% | B |
| Example 11 | 1-21 | Ink (11) | 67.4 | 57.4 | A | −38.4 | −55.4 | A | A | 75% | B |
| Example 12 | 1-22 | Ink (12) | 65.8 | 58.6 | A | −38.4 | −53.4 | A | A | 78% | B |
| Example 13 | 1-23 | Ink (13) | 68.9 | 55.7 | A | −39.4 | −56.5 | A | A | 86% | A |
| Example 14 | 1-24 | Ink (14) | 66.6 | 56.2 | A | −38.2 | −54.6 | A | A | 87% | A |
| Comparative Example 1 | D-1 | Comparative ink (1) | 76.3 | 47.6 | B | −14.6 | −74.9 | C | C | 79% | B |
| Comparative Example 2 | D-2 | Comparative ink (2) | 70.2 | 49.7 | B | −32.1 | −62.5 | B | C | 76% | B |
| Comparative Example 3 | D-3 | Comparative ink (3) | 60.4 | 63.2 | A | −28.7 | −53.2 | B | C | 60% | C |
| Comparative Example 4 | D-4 | Comparative ink (4) | 61.5 | 53.8 | C | −12.4 | −60.2 | C | C | 36% | C |
| Comparative Example 5 | D-5 | Comparative ink (5) | 52.2 | 54.2 | C | −20.1 | −48.2 | C | B | 40% | C |

As shown in Table 1, it was found that the ink of the example containing the compound represented by General Formula (1) exhibited the cyan color having excellent high chroma, high light fastness, and storage stability as compared with the comparative ink.

<Production of Color Filter>

The resist composition for a color filter and a color filter were produced by a method described below.

Example 15

One hundred and twenty parts of cyclohexanone were mixed with 12 parts of the compound (1-4) synthesized by Production Example 1, and the mixture was dispersed for 1 hour with an attritor (manufactured by Mitsui Mining Co., Ltd.), thereby obtaining an ink (1) for a resist composition.

Subsequently, 22 parts of the ink (1) for a resist composition were slowly added to 96 parts of a cyclohexanone solution in which 6.7 parts of an acrylic copolymer compo- Comparative Examples 6 to 10

Resist compositions (1) to (5) for a comparative color filter were obtained in the same manner as that of Example 15, except that the compound (1-4) was changed to comparative compounds (D-1) to (D-5). In addition, comparative color filters (1) to (5) were produced in the same operation as that of Example 15, except that the obtained resist compositions (1) to (5) for a comparative color filter were used instead of the resist composition (1) for a color filter.

[Chroma and Hue Evaluation]

White PET was placed under each color filter, the chromaticity (L*, a*, and b*) of each sample in a L*a*b* color system was measured with a spectral densitometer (fluorescence spectral densitometer FD-7, manufactured by KONICA MINOLTA, INC.), and the chroma (C*) was calculated by the following equation. The evaluation criteria are the same as those in Examples 1 to 14.

[Storage Stability Evaluation]

Each color filter was left at a temperature of 40° C./humidity of 80% for 7 days and then stored at a temperature of 10° C./humidity of 30% for one month, and then a surface state was observed by magnifying the surface 20 times with a phase-contrast microscope (trade name: BX53, manufactured by Olympus Corporation).

The evaluation criteria are as follows.
A: Almost no aggregate of the compound was observed (very excellent in the storage stability).
B: A small amount of aggregate of the compound was observed (excellent in the storage stability).
C: A considerable amount of aggregate of the compound was observed (inferior in the storage stability).

[Light Fastness Evaluation]

The image sample was injected to a xenon tester (Atlas Weather-Ometer Ci4000, manufactured by Toyo Seiki Seisaku-sho, Ltd.), and then exposed under conditions (illuminance: 0.36 W/m$^2$ at 340 nm, black panel temperature: 50° C., and relative humidity: 50%) for 5 hours. When an initial optical concentration was set as $OD_0$ and O.D. after the exposure for 5 hours was set as $OD_5$, an O.D. residual rate was defined as follows.

O.D. residual rate (%)=($OD_5/OD_0$)×100

The evaluation criteria are as follows.
A: 80<O.D. residual rate (%)
B: 80<O.D. residual rate (%)≤60
C: O.D. residual rate (%)≤60

The obtained results are shown in Table 2.

kg/hr (the temperature of a kneaded product during discharge was about 150° C.). After the obtained kneaded product was cooled and then coarsely pulverized with a hammer mill, fine pulverization was performed in a Feed amount of 20 kg/hr with a mechanical pulverizer (trade name: T-250, manufactured by Turbo Kogyo Co., Ltd.). Furthermore, the obtained finely pulverized product was classified with a multi-division classifier using a Coanda effect, thereby obtaining a toner particle.

Two parts of a silica fine particle were added to 100 parts of the obtained toner particle using a Henschel mixer, thereby obtaining a toner (1). A weight average particle diameter (D4) of the obtained toner was about 6.0 µm, a rate of particles having a particle diameter of 4.1 µm or less was 31.0% in number, and a rate of particles having a particle diameter of 10.1 µm or more was 0.7 vol %.

A fixed image having a mounted amount of the toner of 0.45 mg/cm$^2$ was prepared on CLC color copy paper (manufactured by Canon Inc.) using a modified LBP-5300 (trade name, manufactured by Canon Inc.). The chromaticity (L*, a*, and b*) of the chroma of the obtained image in a L*a*b* color system was measured with a spectral densitometer (fluorescence spectral densitometer FD-7, manufactured by KONICA MINOLTA, INC.). When C*=65, L*=62, a*=44, and b*=48, a cyan color having a high chroma was exhibited.

A light fastness test as in Examples 1 to 14 was performed on the image, an O.D. residual rate (%) was 80% or higher.

In addition, 1 g of the toner was placed in a 10 cc resin cup, left at a temperature of 40° C./humidity of 80% for 7

TABLE 2

|  | Compound | C* | L* | Chroma evaluation | a* | b* | Cyan color | Storage stability | OD residual rate after 5 hours | Light fastness |
| --- | --- | --- | --- | --- | --- | --- | --- | --- | --- | --- |
| Example 15 | 1-4 | 68.1 | 62.0 | A | −45.2 | −51.0 | A | A | 85% | A |
| Example 16 | 1-8 | 65.2 | 58.3 | A | −38.0 | −53.0 | A | A | 78% | B |
| Example 17 | 1-12 | 65.6 | 60.7 | A | −41.0 | −51.2 | A | A | 86% | A |
| Example 18 | 1-15 | 66.3 | 62.0 | A | −38.2 | −54.2 | A | A | 90% | A |
| Example 19 | 1-17 | 67.4 | 53.2 | A | −44.0 | −51.0 | A | A | 89% | A |
| Example 20 | 1-23 | 67.8 | 56.2 | A | −39.0 | −56.5 | A | A | 86% | A |
| Example 21 | 1-24 | 71.8 | 55.1 | A | −25.3 | −68.2 | A | A | 87% | A |
| Comparative Example 6 | D-1 | 70.4 | 43.2 | B | −14.6 | −68.9 | C | C | 79% | B |
| Comparative Example 7 | D-2 | 70.7 | 48.1 | B | −33.1 | −62.5 | C | B | 65% | B |
| Comparative Example 8 | D-3 | 61.2 | 62.0 | A | −30.2 | −58.2 | C | C | 45% | C |
| Comparative Example 9 | D-4 | 63.7 | 52.0 | C | −12.4 | −62.5 | C | C | 50% | C |
| Comparative Example 10 | D-5 | 52.2 | 53.3 | C | −20.0 | −48.2 | C | C | 42% | C |

<Production of Toner>

A toner was produced by a method described below.

Example 22

Binder resin (polyester resin): 100 parts
(Tg: 55° C., acid value: 20 mgKOH/g, hydroxyl value: 16 mgKOH/g, molecular weight: Mp 4500, Mn 2300, Mw 38000)
C.I. Pigment Blue 15:3 5 parts
Compound (1-4): 0.5 parts
1,4-di-t-butylsalycilic acid aluminum compound: 0.5 parts
Paraffin wax (maximum endothermic peak temperature: 78° C.): 5 parts After the materials were sufficiently mixed well with each other with a Henschel mixer (trade name: FM-75J type, manufactured by Mitsui Mining Co., Ltd.), kneading was performed with a twin-screw kneader (trade name: PCM-45 type, manufactured by Ikegai Ironworks Corp.) which was set at a temperature of 130° C. and in a Feed amount of 60 days, and further left at a temperature of 10° C./humidity of 30% for one month, and then the presence or absence of an aggregate was examined. As a result, it was confirmed that almost no aggregate was observed and the storage stability was very excellent.

According to the present invention, it is possible to provide a compound exhibiting a cyan color having excellent high chroma, high light fastness, and storage stability. In addition, according to the present invention, it is possible to provide an ink, a resist composition for a color filter, a sheet for heat-sensitive transfer recording, and a toner that exhibit a cyan color having excellent high chroma, high light fastness, and storage stability.

The compound of the present invention is a compound exhibiting a cyan color having excellent high chroma, high light fastness, and storage stability. The compound of the present invention can be preferably used for an ink, a resist composition for a color filter, a sheet for heat-sensitive transfer recording, and a coloring agent of a toner.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A compound represented by formula (1):

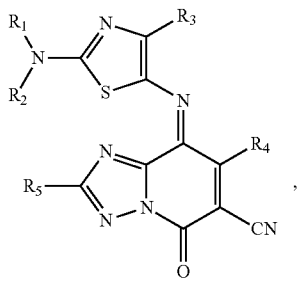

wherein, in the formula (1):

$R_1$ and $R_2$ each independently represents a linear alkyl group having 6 to 12 carbon atoms, a branched alkyl group having 6 to 12 carbon atoms, or a cyclic alkyl group having 6 to 12 carbon atoms;

$R_3$ represents a 4-halogenated phenyl group or a 3-alkoxyphenyl group;

$R_4$ represents a linear alkyl group having 1 to 8 carbon atoms, a branched alkyl group having 1 to 8 carbon atoms, or a cyclic alkyl group having 1 to 8 carbon atoms; and $R_5$ represents a linear alkyl group having 1 to 8 carbon atoms, a branched alkyl group having 1 to 8 carbon atoms, or a cyclic alkyl group having 1 to 8 carbon atoms or a benzyl group.

2. The compound according to claim 1, wherein each of $R_1$ and $R_2$ in the formula (1) is a 2-ethylhexyl group.

3. The compound according to claim 1, wherein $R_3$ in the formula (1) is a 3-methoxyphenyl group or a 4-chlorophenyl group.

4. An ink comprising:
a medium; and
the compound of claim 1 present in a dissolved or dispersed state in the medium.

5. A resist composition for a color filter comprising the compound of claim 1.

6. A sheet for heat-sensitive transfer recording comprising:
a substrate; and
a coloring material layer formed on the substrate,
wherein the coloring material layer contains the compound of claim 1.

7. A toner comprising:
a binder resin; and
a coloring agent,
wherein the coloring agent contains the compound of claim 1.

* * * * *